US009106184B2

(12) United States Patent
Ohnishi

(10) Patent No.: US 9,106,184 B2
(45) Date of Patent: Aug. 11, 2015

(54) HIGH-FREQUENCY AMPLIFIER, AND HIGH-FREQUENCY MODULE AND WIRELESS TRANSCEIVER USING SAME

(75) Inventor: Masami Ohnishi, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 104 days.

(21) Appl. No.: 13/884,958

(22) PCT Filed: Aug. 31, 2011

(86) PCT No.: PCT/JP2011/069769
§ 371 (c)(1),
(2), (4) Date: May 11, 2013

(87) PCT Pub. No.: WO2012/066839
PCT Pub. Date: May 24, 2012

(65) Prior Publication Data
US 2013/0229235 A1    Sep. 5, 2013

(30) Foreign Application Priority Data
Nov. 17, 2010    (WO) .................. PCT/JP2010/070497

(51) Int. Cl.
*H03G 3/20*     (2006.01)
*H03F 3/193*    (2006.01)
*H03F 1/02*     (2006.01)
*H03F 3/24*     (2006.01)

(52) U.S. Cl.
CPC .............. *H03F 3/193* (2013.01); *H03F 1/0266* (2013.01); *H03F 3/24* (2013.01); *H03F 2200/102* (2013.01); *H03F 2200/27* (2013.01); *H03F 2200/435* (2013.01); *H03F 2200/511* (2013.01); *H03F 2200/555* (2013.01); *H03F 2200/78* (2013.01)

(58) Field of Classification Search
CPC ........................................................ H03F 3/193
USPC ................................................. 330/136, 297
See application file for complete search history.

(56) References Cited

U.S. PATENT DOCUMENTS

2004/0227577 A1    11/2004    Noh et al.
2009/0191923 A1    7/2009    Fudaba et al.

FOREIGN PATENT DOCUMENTS

| JP | 62-277806 A | 2/1987 |
| JP | 04-119707 A | 4/1992 |
| JP | 04-372212 A | 12/1992 |
| JP | 10-135745 A | 5/1998 |
| JP | 2004-343707 A | 12/2004 |
| JP | 2009-177640 A | 8/2009 |
| JP | 2010-016794 A | 1/2010 |
| WO | WO 2008/044276 A1 | 4/2008 |
| WO | WO 2010/076845 A1 | 7/2010 |

*Primary Examiner* — Robert Pascal
*Assistant Examiner* — Khiem Nguyen
(74) *Attorney, Agent, or Firm* — Miles & Stockbridge P.C.

(57) ABSTRACT

There are provided a high-frequency amplifier and a high-frequency module having a high efficiency for an extensive input modulated signal power, and base station/mobile wireless machines using the amplifier or the module.
The high-frequency amplifier includes a circuit that detects an envelope of an input modulated signal; a control signal generator circuit (a voltage controlled circuit or a current controlled circuit) that can change a voltage or a current according to a given function on the basis of a magnitude of the detected envelope signal; and a diode clamped variable power circuit that connects a plurality of diode clamped circuits each including a diode, a transistor, and a DC power supply to one another.

15 Claims, 24 Drawing Sheets

SOLID LINE, THIS INVENTION
DASHED LINE, CONVENTIONAL EXAMPLE

HIGH-FREQUENCY AMPLIFIER, AND HIGH-FREQUENCY MODULE AND WIRELESS TRANSCEIVER USING SAME

TECHNICAL FIELD

The present invention relates to a high-frequency amplifier that amplifies a high-frequency analog signal, and a high-frequency module, a base station wireless transceiver, and a mobile wireless transceiver using the high-frequency amplifier, and particularly to a high-frequency amplifier, and a high-frequency module and base station/mobile wireless transceiver using the high-frequency amplifier, which are suitable for a wireless communication using not only a GSM system using a saturated amplifier, but also a CDMA system and an OFDM (orthogonal frequency division multiplexing) system using a high-linearity amplifier, and extended systems thereof.

BACKGROUND ART

As amplifiers of a high-frequency analog signal, amplifiers disclosed in PTL 1 and PTL 2 have been known up to now.

PTL 1 discloses, as illustrated in FIG. 21, an amplifier employing an ET system (envelope tracking) which changes a DC bias voltage on an output side of a high-frequency amplifier element according to an envelope signal of an input modulated signal as means for enhancing an efficiency of a high-frequency amplifier 1603. That is, as a method of making the output side DC bias voltage variable, a current controlled variable resistor (transistor) 1610 is inserted in series with a variable voltage switching power supply 1609 to realize the ET system. Reference numeral 1601 denotes an input terminal, 1602 is an output terminal, 1604 is a directional coupler, 1605 is a detector circuit, and 1606 is a peak detector. Also, the high-frequency amplifier disclosed in PTL 2 includes a voltage controlled circuit that changes a voltage to be applied to a drain electrode or a collector electrode of a semiconductor amplifier element substantially in proportion to an envelope component of an input signal which is supplied to a control electrode of the semiconductor amplifier element. The voltage controlled circuit has a plurality of batteries connected in series at connection points, and a control transistor is connected in parallel to the respective connection points.

Paragraphs [0066] to [0106] and FIG. 6 of PTL 3 disclose a power amplifying device of an envelope tracking four-voltage switching system in which four fixed voltage power supplies each having a different potential are connected in parallel to a supply terminal of a power amplifier through respective diodes, and power changeover switches 51 to 53 of three power circuits in the high-frequency amplifier turn on/off according to an envelope of the input signal to switch a supply voltage to be applied to the power amplifier in a stepped manner.

Paragraphs [0002] to [0006] and FIG. 5 of PTL 4 disclose an amplifier that switches a supply voltage according to a magnitude of an input signal in which a supply voltage switching circuit includes a plurality of switches which are connected in series with a pair of transistors configuring a push-pull circuit, and conducts on/off operation, and a plurality of supply voltages which are connected to interstages of the respective switches through respective diodes.

PTL 5 discloses an amplifier circuit that switches a supply voltage according to a signal, which includes a comparator that compares an output signal of an amplifier with a supply voltage, and controls the supply voltage switching circuit according to an output of the comparator.

PTL 6 discloses

A Power amplifier for multi-mode terminals that accepts a plurality of modulation systems in which an amplification control unit calculates a ratio of a peak power to a mean power for each modulation mode, and makes a supply voltage variable on the basis of the calculation results.

PTL 7 discloses a power amplifier circuit including an RF choke connected between a collector of an amplification transistor and a power supply, and a capacitor and a bias circuit between the collector and an output terminal.

PTL 8 discloses an amplifier of an ET (envelope tracking) system which controls a drain voltage of a power amplifier stage according to an envelope variation of a transmit signal in which the drain voltage is controlled according to a frequency Pr at which a ratio of an instantaneous power to a mean power of the transmit signal exceeds a given threshold value.

CITATION LIST

Patent Literature

PTL 1: JP-A-4 (1992)-119707
PTL 2: JP-A-62 (1987)-277806
PTL 3: JP-A-2010-16794
PTL 4: JP-A-4 (1992)-372212
PTL 5: JP-A-10 (1998)-135745
PTL 6: PCT International Publication No. WO2008/044276A1
PTL 7: JP-A-2004-343707
PTL 8: JP-A-2009-177640

SUMMARY OF INVENTION

Technical Problem

An efficiency E of the ET amplifier is expressed by a product of an efficiency E1 of a variable power supply portion and an efficiency E2 of a high-frequency amplifier portion, $E=E1 \times E2$. That is, in the ET system, because the efficiencies of not only the high-frequency amplifier portion but also the variable power supply portion largely affect the overall efficiency, research has been advanced toward higher efficiency of the variable power supply portion in order to realize the ET system.

In PTL 1, as the method of making the output side DC bias voltage variable, the current controlled variable resistor (transistor) is inserted in series with the voltage variable switching power supply to realize the ET system. However, when the current controlled variable resistor becomes larger, and the output current is increased in a low voltage operation, a power consumption becomes larger in the current controlled variable resistor portion. As a result, the efficiency of the pure high-frequency amplifier portion is improved whereas a power consumption of the power supply portion is increased.

The high-frequency amplifier disclosed in PTL 2 is configured so that the plurality of batteries are connected in series at the connection points (maximum withstand voltage Vdd), and the respective control transistors are connected in parallel to the respective connection points. For that reason, all withstand voltages of the respective control transistors are different from one another. In this case, the control transistors all having the same specification can be used, but there is a need to adjust the control transistors to the maximum withstand voltage Vdd. Also, in the control transistor large in the withstand voltage, because an on-resistance and an input capacity become larger, operation at a high frequency becomes extremely difficult, and the efficiency is further lessened.

On the other hand, as the recent wireless standards, a digital modulation system such as a GSM system, a CDMA system, or an OFDM system is applied to a great number of mobile wireless terminals and base stations such as 3 to 4 G cellular phones (LTE, LET-A), WLAN, and WiMAX. Also, in those digital modulation systems, the amount of information to be treated has increased year after year, and an extremely high linearity is required for the power amplifier used on a transmitter side.

That is, unlike a system based on an FSK (frequency modulation system) and a PSK (phase modulation system) such as a conventional GMSK system in which an electric power of a high-frequency signal is not temporally varied, a CDMA system and an OFDM system have a feature that the electric power of the high frequency signal is temporally varied, and a peak value is much larger than the mean value. An amplifier intended to amplify an analog signal (in terms of temporally varying a level) large in a difference between a peak power value and a mean power value, requires a high linearity for the input signal in a wide range from a small signal operation time to a large signal operation time. In order to obtain the high linearity, normally, a large output back-off is taken to realize the high linearity whereby a signal demodulation error can be reduced even when a peak power is generated. However, when the large output back-off is taken, the efficiency is reduced in the high-frequency amplifier (a current consumption is increased in the high-frequency amplifier). In the ET system which is one of the methods for solving this, the output side DC bias voltage is made variable according to the envelope to reduce the electric power that has been transformed into heat in a semiconductor element used in the high-frequency amplifier, thereby improving the efficiency.

However, as described above, the efficiency E of the ET amplifier is also largely affected by the efficiency of a variable power circuit per se, and an enhancement of the efficiency in this portion becomes an important issue.

The power amplifying device disclosed in PTL 3 is of a system in which one voltage is selected from voltages V1 to V4 to be applied to a supply voltage selection unit, and a supply voltage to be applied to the power amplifier is switched in a stepped manner. That is, as illustrated in FIG. 22, power changeover switches SW1 to SWn turn on/off according to the envelope of an input signal to switch the supply voltage, which is applied to the power amplifier, to Vdd/n, 2×Vdd/n, 3×Vdd/n or n×Vdd/n=Vdd in a stepped manner. According to this system, as in PTL 2, the power changeover switches are connected in parallel to the respective connection points. For that reason, all withstand voltages of the respective power changeover switches are different from one another. In this case, for example, the transistors all having the same specification can be used as the power changeover switches, but there is a need to adjust those transistors to the maximum withstand voltage Vdd. Also, in the power changeover switch large in the withstand voltage, because an on-resistance and an input capacity become larger, operation at a high frequency becomes extremely difficult, and the efficiency is lessened.

Further, as indicated by an undulating line in FIG. 23, the supply voltage from the supply voltage selection unit becomes a stepped voltage waveform, and causes a difference from an ideal voltage. The difference from the ideal voltage needs to be adjusted on the basis of a signal from an envelope detector in a supply voltage adjustment unit. However, a power consumption in the supply voltage selection unit and the supply voltage adjustment unit, which is associated with this adjustment, largely affects the efficiency of an overall power supply portion.

The power amplifiers disclosed in PTL 4 and PTL 5 are also configured to apply the stepped supply voltage, and the power consumption in the power supply portion is increased.

The power amplifiers disclosed in PTL 6 to PTL 8 do not take care of an increase in the power consumption in the power supply portion, either.

An object of the present invention is to provide a high-frequency amplifier, and a high-frequency module and base station/mobile wireless transceiver using the high-frequency amplifier, which improve the efficiency of the variable power circuit per se, improve the efficiency E of the overall high-frequency amplifier, and have the high linearity and the high efficiency for an extensive input modulated signal power as described above.

Solution to Problem

A typical example of the present invention will be described below. According to the present invention, there is provided a high-frequency amplifier having a high-frequency amplifying unit that amplifies and outputs a modulated analog signal, the high-frequency amplifier including: an envelope signal acquisition unit for acquiring an envelope signal of the modulated analog signal; a control signal generator circuit that generates a control signal; and a diode clamped variable power circuit that is connected to a supply terminal of the high-frequency amplifying unit, and functions as a power circuit of the high-frequency amplifying unit, in which the diode clamped variable power circuit includes a plurality of diode clamped circuits each having a DC power supply, a diode, and a power transistor, in which each of the diode clamped circuits has an output terminal that outputs a voltage of the DC power supply through the diode, in which the diode clamped variable power circuit is structured to stack the clamped circuits in a multistage manner, and the plurality of diode clamped circuits are connected in a multistage manner through the respective output terminals so that the plurality of power transistors are connected in series with the supply terminal, in which the respective DC power supplies corresponding to the respective power transistors are connected in series with one another, in which the control signal generator circuit generates a control signal that is changed according to a linear function on the basis of a magnitude of the envelope signal, and in which the respective power transistors of the respective diode clamped circuits are controlled according to the control signal which is changed according to the linear function, individually, to change the supply voltage of the high-frequency amplifying unit according to the magnitude of the modulated analog signal.

Advantageous Effects of Invention

According to the present invention, there can be provided a high-frequency amplifier, and a high-frequency module and base station/mobile wireless transceiver using the high-frequency amplifier, which improve the efficiency of the variable power circuit per se, improve the efficiency of the overall high-frequency amplifier, and maintain the high linearity for an extensive input modulated signal power.

DESCRIPTION OF EMBODIMENTS

Figure 1:
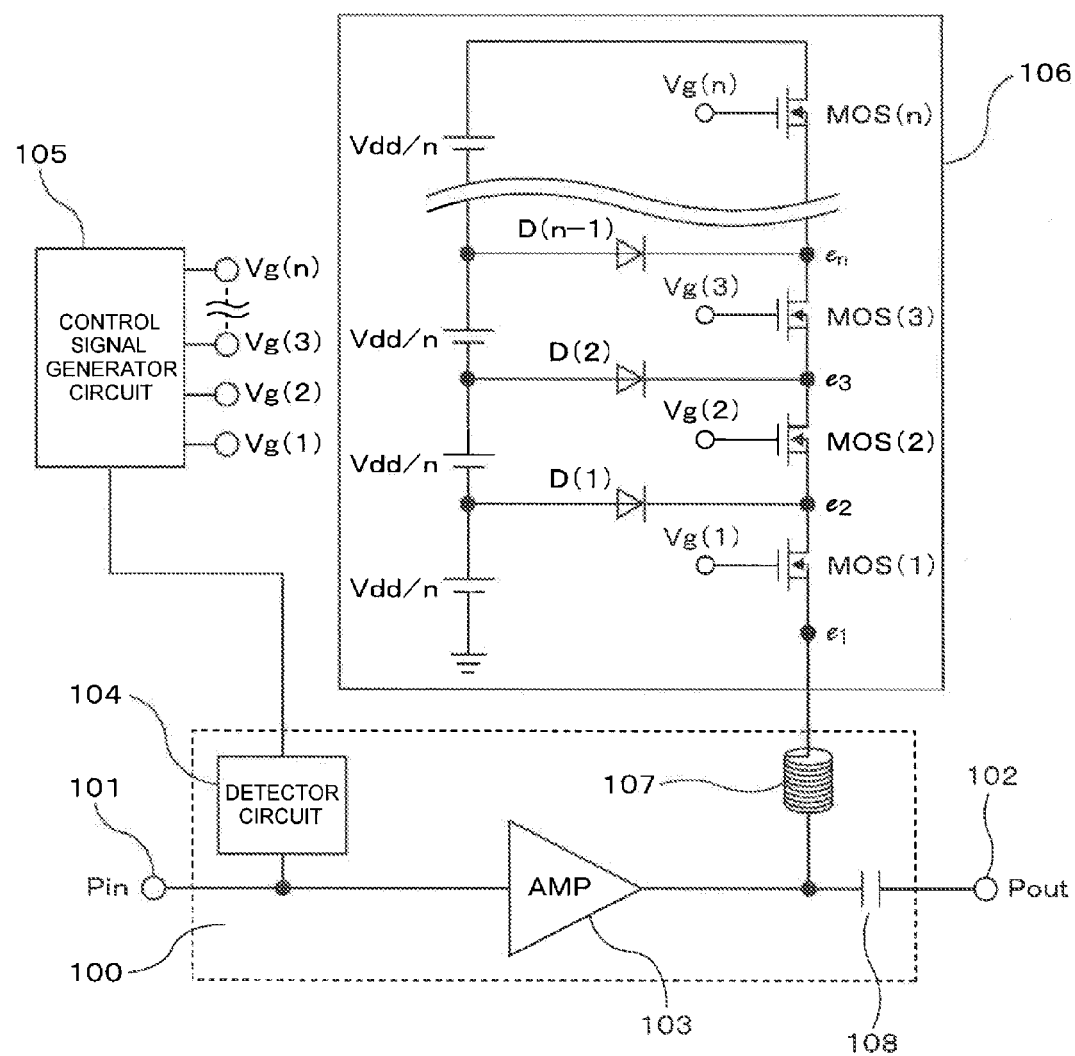
FIG. 1 is a diagram illustrating a configuration of a high-frequency amplifier according to a first embodiment of the present invention.

A high-frequency amplifier of the present invention is achieved by a high-frequency amplifier including: an input terminal and an output terminal of a high-frequency modulated signal; a high-frequency amplifier having a semiconductor amplifying element for amplifying a modulated signal; a circuit that detects an envelope of the input modulated signal to output the envelope as an envelope signal; a control signal generator circuit (a voltage controlled circuit or a current controlled circuit) that can change a voltage or a current according to a given function on the basis of a magnitude of the detected envelope signal; and a diode clamped variable power circuit that connects a plurality of diode clamped circuits each including a diode, a transistor, and a DC power supply to one another.

The above diode clamped variable power circuit is structured such that a plurality of clamped circuits each including the DC power supply, the diode, and the transistor are vertically stacked on one another. However, in an uppermost portion thereof, because a reverse current is generated, the diode is not always required, and a DC ground portion of a DC power supply is only the DC power supply in a lowermost portion.

Also, in the high-frequency amplifier according to the present invention, a DC supply voltage value needs to be set to such a value that a total of the respective DC supply voltage values can accept a maximum instantaneous power or a peak power. In the division number of DC power supply, when the number of division is increased, that is, the respective DC supply voltage values are decreased, the efficiency of the diode clamped variable power circuit is improved. Further, when the respective DC supply voltage values are decreased, the diodes and the transistors used in the diode clamped variable power circuit can be downsized. As a result, because a parasitic capacitance component and a parasitic inductance component provided in the diodes and the transistors are decreased, attenuation and phase deviation are reduced in a high frequency component of the envelope of the modulated signal thereby making it possible to follow a high-speed envelope, and improve the power efficiency.

Further, if the total of the respective DC supply voltage values is the value that can accept the maximum instantaneous power or the peak power as the power circuit of the high-frequency amplifier, it is not always necessary that all of the respective DC supply voltage values are identical with one another. A neighborhood of the output side DC bias voltage value corresponding to the instantaneous power value high in the occurrence frequency by the occurrence probability of the instantaneous power of the input modulated signal wave may be segmentalized. As a result, the output side DC bias voltage values can be optimized for various modulation systems to improve the power efficiency.

Also, in the high-frequency amplifier according to the present invention, the DC supply voltage value needs to be set to different values depending on a variety of communication systems, or a cell area that covers a base station that a total of the respective DC supply voltage values can accept a maximum instantaneous power or a peak power. Also, the DC supply voltage value of the high-frequency amplifier needs to be optimized for a mean output power depending on the variety of communication systems, or the cell area that covers the base station. For that reason, the control signal for changing the total of the respective DC supply voltage values of the power circuit of the high-frequency amplifier may be acquired from a baseband circuit or an RFIC unit disposed at a previous stage of the high-frequency amplifier. As a result, the total of the respective DC supply voltage values can be made variable, thereby being capable of improving the efficiency of the diode clamped variable power circuit and improving the power efficiency.

In the high-frequency amplifier according to the present invention, in the diode clamped variable power circuit in which the plurality of diode clamped circuits each having the diode, the transistor, and the DC power supply are connected to one another, a maximum current value is determined according to a rated maximum current value of the respective diode and transistor used in the circuit. For that reason, the sizes of the diode and the transistor must be selected according to a current value necessary for the high-frequency amplifier. However, when the diode and the transistor are sized up to increase the rated maximum current value, the parasitic capacitance component and the parasitic inductance component provided in the diode and the transistor are increased. For that reason, attenuation and phase deviation are generated in the high frequency component of the envelope of the modulated signal, depending on the intended use. That is, in the case of a large-output amplifier, because a large current flows therein, if large sizes of the diode and the transistor are used, there is a possibility that the high-speed envelope is not followed. Under the circumstances, in the above intended use, a plurality of diode clamped variable power circuits each having the small sizes of the diode and the transistor which are small in the amount of the parasitic capacitance component and the amount of the parasitic inductance component are connected in parallel to one another in the DC output terminal portion, thereby being capable of following the high-speed envelope, and improving the power efficiency.

Also, in the high-frequency amplifier according to the present invention, a voltage comparator is inserted into an output unit of the diode clamped variable power circuit in which a plurality of diode clamped circuits are connected to one another, and a voltage or a current can be fed back to the control signal generator circuit (the voltage controlled circuit or the current controlled circuit) that can change the voltage or the current according to the given function on the basis of the magnitude of the envelope signal. With the above configuration, there can be provided the power circuit of the high-frequency amplifier in which the DC voltage variation is small and stable, and the power efficiency is improved.

Also, in the high-frequency amplifier according to the present invention, as envelope signal acquiring means for acquiring the envelope signal of the modulated analog signal, the envelope signal is acquired from the baseband circuit or the RFIC unit disposed in the previous stage of the high-frequency amplifier, instead of the detector circuit provided on an input unit which detects the envelope of the modulated signal, and outputs the envelope as the envelope signal. As a result, the power efficiency can be improved without any increase in the circuit scale of the high frequency portion.

According to the present invention, the high-frequency amplifier, and the high-frequency module, the base station wireless transceiver, and the mobile wireless transceiver using the high-frequency amplifier can be used in not only a GSM system using a saturated amplifier, but also a CDMA system and an OFDM (orthogonal frequency division multiplexing) system using a high-linearity amplifier, and extended systems thereof. As a result, the present invention contributes to an enhancement in the efficiency of the high-frequency amplifier, and the high-frequency module, the base station wireless transceiver, and the mobile wireless transceiver using the high-frequency amplifier in a wide dynamic range.

Hereinafter, embodiments of the present invention will be described with reference to the accompanying drawings.

First Embodiment

FIG. 1 is a diagram illustrating a configuration of a high-frequency amplifier according to a first embodiment of the present invention. The high-frequency amplifier includes, as a high frequency amplifier circuit unit 100, a high-frequency amplifier element unit (high-frequency amplifying transistor) 103 for amplifying a modulated signal input from an input terminal 101 to output the modulated signal to an output terminal 102, a detector circuit (envelope signal acquiring means) 104 that detects an envelope of the input modulated signal to output the envelope as an envelope signal, a choke inductor 107, and a DC cut capacitor 108. The high-frequency amplifier further includes a control signal generator circuit 105 that can change a control signal (voltage or current) according a given function on the basis of a magnitude of an envelope signal detected by the detector circuit 104, and a diode clamped variable power circuit 106 including a plurality (n−1) diode clamped circuits each having a diode D (1 to (n−1)), a power MOS transistor (1 to n), and a DC power supply Vdd/n. The number n of diode clamped circuits may be appropriately selected according to the intended purpose, for example, 5 to 10.

In the diode clamped variable power circuit 106, sources and drains of the power MOS transistors in the respective clamped circuits are connected in series with a supply terminal of the high-frequency amplifier unit 103 at respective output terminals e1 to en. For example, the respective power MOS transistors are connected in series with a drain (or source) end which is a supply terminal of the high-frequency amplifier unit 103 including a MOS transistor, through a choke inductor 107, and a source (or drain) end of the high-frequency amplifier unit 103 is grounded. Alternatively, when the high-frequency amplifier unit 103 includes a bipolar transistor, the respective power MOS transistors are connected in series with a supply terminal (collector) of the high-frequency amplifier unit 103, and the other terminal (emitter) is grounded. That is, the respective power transistors of the respective diode clamped circuits are connected in series with one another in a multistage manner through the respective output terminals e1 to en. Also, the respective DC power supplies Vdd/n corresponding to the respective power transistors connected in series with one another in the multistage manner are connected in series with one another in the multistage manner. The diode of each diode clamped circuit connects the DC power supply and the power transistor in a corresponding stage. For example, the lowermost diode clamped circuit includes the (first) DC power supply Vdd/n having one end grounded, the diode D(1), and the power MOS transistor (1). A source of the power MOS transistor (1) and a drain of the MOS transistor (2) are connected to the output terminal (connection terminal) e2 of the clamped circuit.

Also, control voltages Vg(1) to Vg(n) or control currents generated by the control signal generator circuit 105 are supplied to the gates of the respective power MOS transistors. A maximum value of the DS power supply is n×(Vdd/n), that is, Vdd. The high-frequency amplifier detects a modulated signal Pin to be input to the high-frequency amplifier 103 by the detector circuit 104 to detect the envelope. Then, the high-frequency amplifier controls the diode clamped variable power circuit 106 on the basis of the envelope signal which is a detected output by the variable signal generator circuit 105, and changes an output side DC bias voltage of the high-frequency amplifier 103 according to the envelope.

The high-frequency amplifier unit 103 according to this embodiment includes at least one semiconductor amplifying element that amplifies and outputs an input modulated wave signal, and input side and output side bias circuits in each stage, for applying a DC bias to the semiconductor amplifying element. The high-frequency amplifier unit 103 operates the diode clamped variable power circuit 106 on the basis of the magnitude of the envelope signal detected by the detector circuit 104, thereby being capable of changing the output side DC applied voltage of the semiconductor amplifying element unit 103 according to the given function on the basis of the magnitude of the envelope signal.

In this embodiment, the choke inductor 107 which is a final stage output side bias circuit, and the DC cut capacitor 108 are arranged outside the high-frequency amplifier unit 103. Alternatively, even if functions corresponding to those elements are disposed inside the high-frequency amplifier unit 103, the same operation is conducted.

The modulated wave signal Pin input from the input terminal 101 is amplified by the high-frequency amplifier unit 103, passes through the DC cut capacitor 108 configuring the final stage output side bias circuit, and is output from the output terminal 102 as an output signal Pout. On the other hand, the modulated wave signal Pin input from the input terminal 101 is detected by the detector circuit 104 to become only an envelope component, which is input to the control signal generator circuit 105. The control signal generator circuit (the voltage controlled circuit or the current controlled circuit) 105 can generate the control voltages Vg(1) to Vg(n) in which the voltage or the current is changed according to a given function on the basis of the magnitude of the envelope signal. This realizes the ET system that changes the output signal Pout of the high-frequency amplifier unit 103 according to the envelope signal of the input modulated signal Pin.

The control voltages Vg(1) to Vg(n) are applied to the gate terminals Vg(1) to Vg(n) (n is a positive integer) of the MOS (1) to MOS(n) which are n-MOS FETs within the diode clamped variable power circuit 106.

The diodes D(1) to D(n−1) within the diode clamped variable power circuit 106 are installed for the purpose of preventing the reverse current from flowing into the respective DC power supplies Vdd/n. The number of diodes D(1) to D(n−1) provided is (n−1), but may also be n without any problem.

For example, the control signal generator circuit 105 linearly changes the control signal on the basis of the magnitude of the detected envelope signal. The control signal generator circuit 105 then operates the diode clamped variable power circuit in which the plurality of diode clamped circuits are connected to one another according to the control signal, to thereby change the output side DC applied voltage of the semiconductor amplifying element according to a linear function on the basis of the magnitude of the envelope signal.

The signal output by the control signal generator circuit 105 in response to the envelope signal can be operated according to a nonlinear function or the linear function. In any case, there is a need to obtain an optimum function in advance for the purpose of enhancing the efficiency of the overall high-frequency amplifier.

Subsequently, the operation of the high-frequency amplifier unit 103 according to this embodiment will be described in more detail with reference to FIGS. 2A to 2C.

Figure 2A:
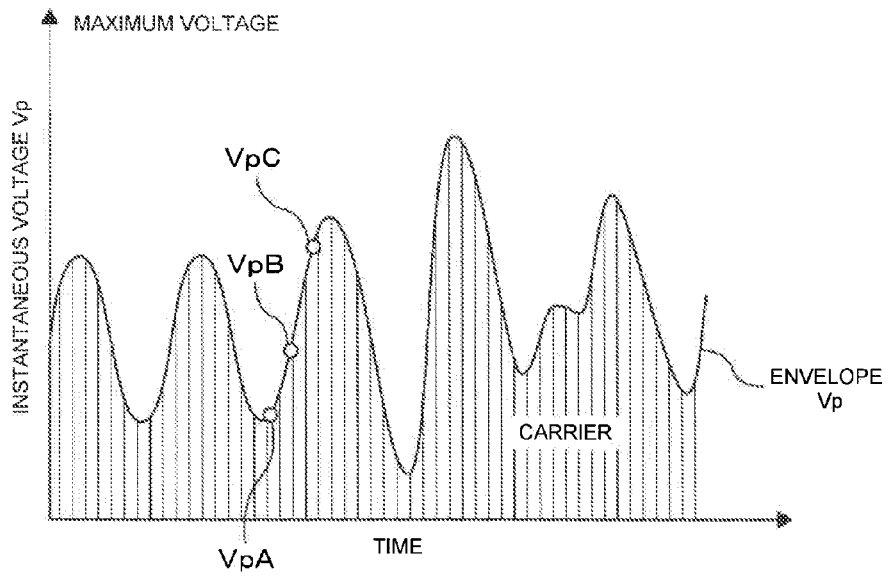
FIG. 2A is a diagram illustrating an example of an envelope signal detected by a detector circuit in the first embodiment.
Figure 2B:
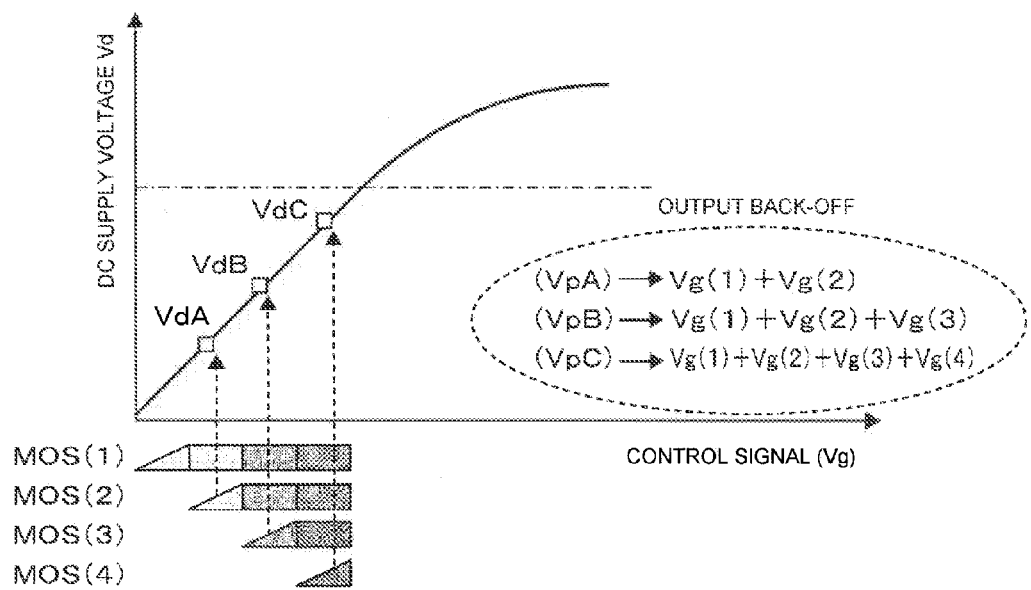
FIG. 2B is a diagram illustrating a relationship of control voltages Vg(1) to Vg(4) to instantaneous voltages VpA, VpB, and VpC of the envelope signal in FIG. 2A.
Figure 2C:
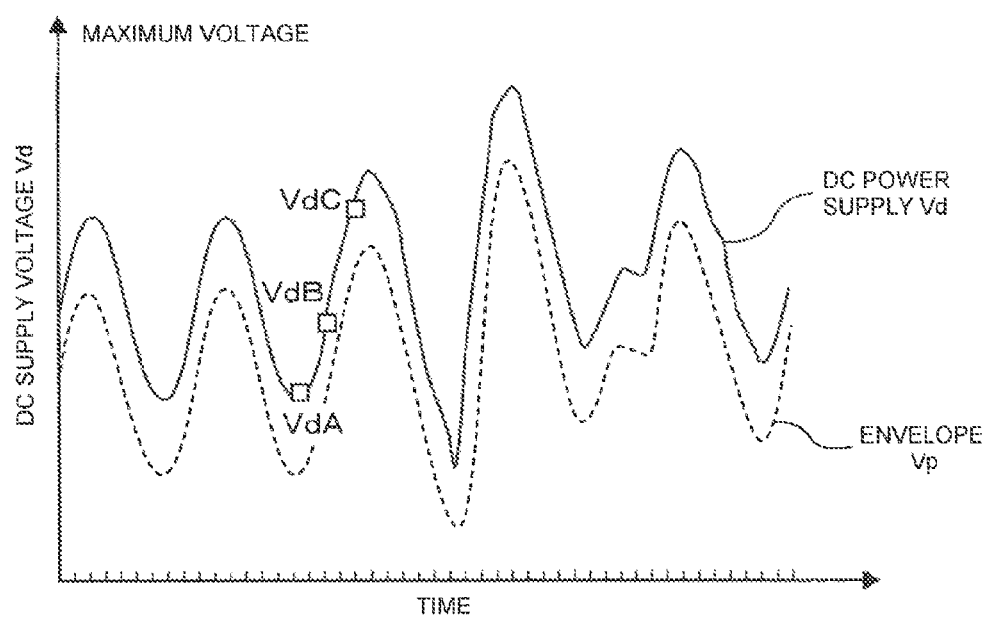
FIG. 2C is a diagram illustrating a relationship of changes of an instantaneous voltage Vp and a DC voltage value Vd with time in the first embodiment.
Figure 23:
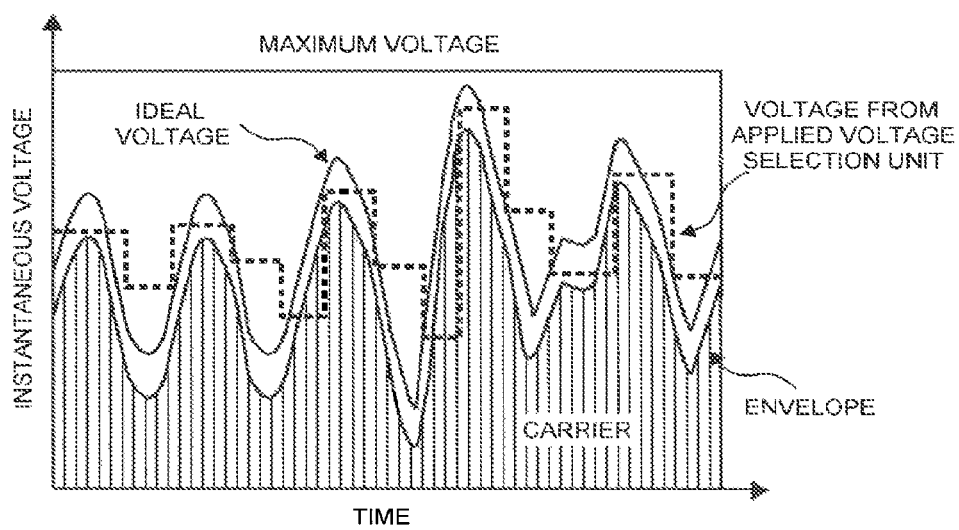
FIG. 23 is a diagram illustrating a relationship of changes in an instantaneous voltage and a supply voltage with time in another conventional example.

FIG. 2A illustrates an example of the envelope signal detected by the detector circuit. FIG. 2B illustrates an example of a relationship of the control voltages Vg(1) to Vg(4) to instantaneous voltages VpA, VpB, and VpC of the envelope signal in FIG. 2A, in other words, a relationship between the gate terminals Vg(1) to Vg(4) of the MOS(1) to MOS(4) within the diode clamped variable power circuit 106, and the DC supply voltage Vd which is an output of the diode clamped variable power circuit 106. As illustrated in FIGS. 2A and 23, according to the magnitude of the envelope signal, if the envelope signal level is small, only MOS(1) operates. As the envelope signal level is more increased, MOS(1)+MOS (2) operate, MOS(1)+MOS(2)+MOS(3) then operate, and MOS(1) to MOS(4) thereafter operate, to thereby obtain DC voltage outputs VdA, VdB, and VdC, respectively. When the DC voltage output is maximum, all of MOS(1)+MOS(2)+MOS(3) ... +MOS(n) operate.

In this situation, the DC voltage output Vd of the diode clamped variable power circuit 106 has a voltage changed on the basis of the magnitude of the control voltage Vg according to the linear function of 0 to Vdd/n [V] in an operating state of the MOS(1), Vdd/n+(0 to Vdd/n) [V] in the operating state of the MOS(1)+MOS (2), 2*Vdd/n+(0 to Vdd/n) [V] in the operating state of the MOS(1)+MOS(2)+MOS(3), and (n−1)*Vdd/n+(0 to Vdd/n) m in the operating state of the MOS(1)+MOS(2)+MOS(3) ... MOS(n) which is at a maximum. Even at the maximum Vdd, MOS is operated on a lower side of the output back-off to obtain an extremely high linearity.

In this way, the DC voltage values Vd such as VdA, VdB, and VdC which are changed according to the liner function in correspondence with the magnitude of the control voltage Vg are applied to the final stage output side bias circuit. FIG. 2C illustrates a relationship of changes of the instantaneous voltage Vp of the envelope and the DC voltage value Vd with time. According to this embodiment, there can be provided the high-frequency amplifier that allows the operation of the variable power circuit to follow the high-speed envelope, maintains the extremely high linearity, and improves the power efficiency.

An improvement in the power efficiency will be described with reference to FIGS. 3 to 5B.

Figure 3:
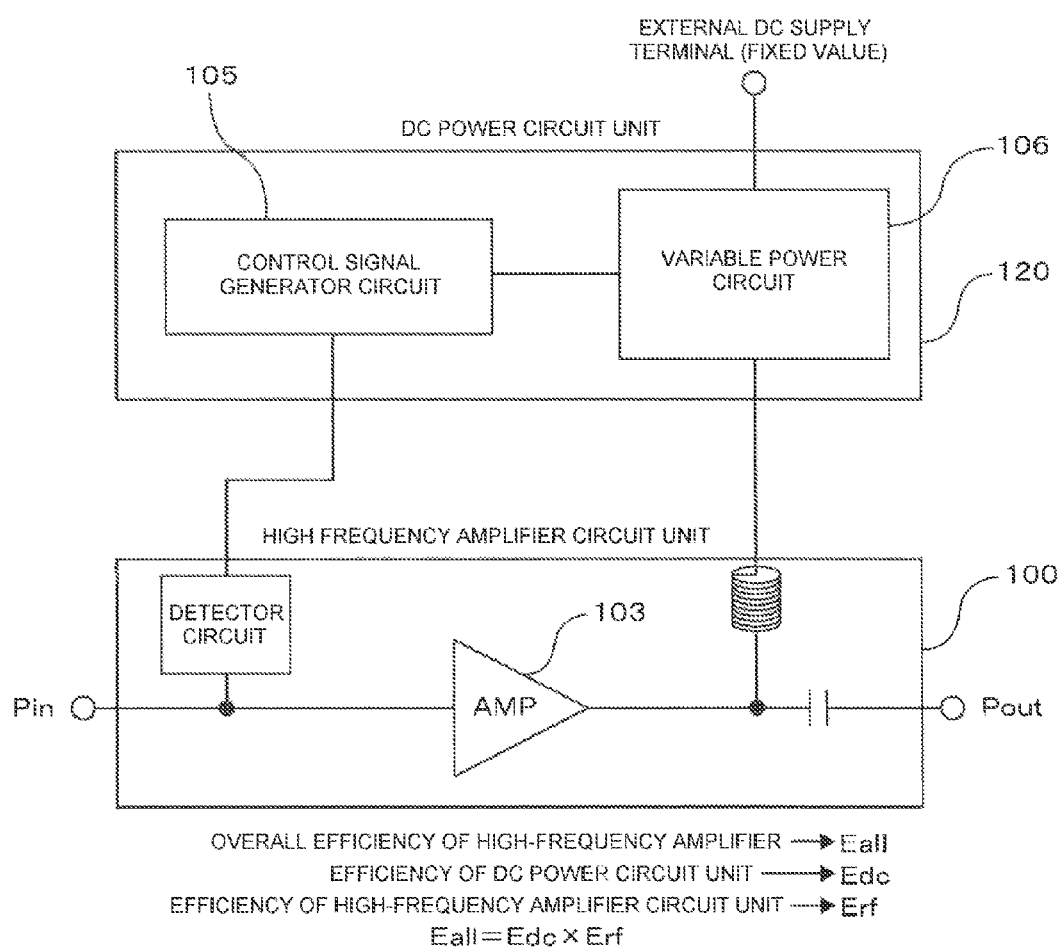
FIG. 3 is a diagram illustrating a relationship of power efficiencies in the high-frequency amplifier.

FIG. 3 illustrates a power efficiency in the high-frequency amplifier. As described above, an efficiency Eall of the ET system amplifier is expressed by a product of an efficiency Edc of a DC power circuit unit 120 including the variable signal generator circuit 105 and the variable power circuit 106, and an efficiency Erf of the high frequency amplifier circuit unit 100 including the high-frequency amplifier unit 103, Eall=Edc×Erf.

Figure 4:
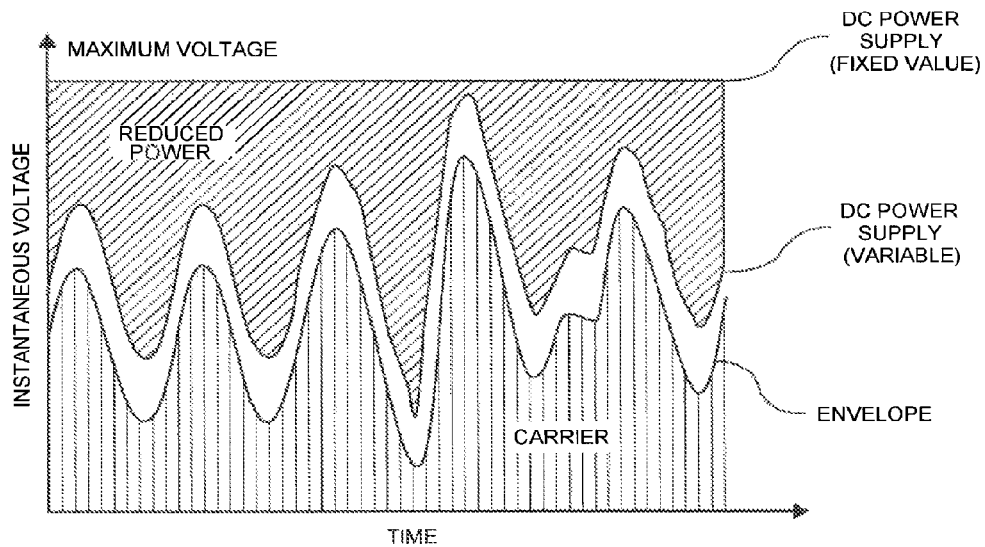
FIG. 4 is a diagram illustrating the effect of a power reduction with the use of an ET system in the first embodiment.

FIG. 4 illustrates a change in the instantaneous voltage and a reduced power with time. In the ET system, a DC power supply to be applied to the high-frequency amplifier unit 103 is configured by a variable power supply controlled by the variable power circuit 106, thereby being capable of remarkably reducing the power consumption as compared with a fixed power supply. That is, as compared with a case in which the output side DC bias voltage is fixed to the maximum voltage, the ET system can make the output side DC bias voltage variable according to the envelope. Therefore, a shaded area in the figure which has been transformed into heat by a semiconductor element used in the high-frequency amplifier is reduced to improve the efficiency. In FIG. 4, it is assumed that the efficiency Edc of the DC power circuit unit 120 is kept constant.

Figure 5A:
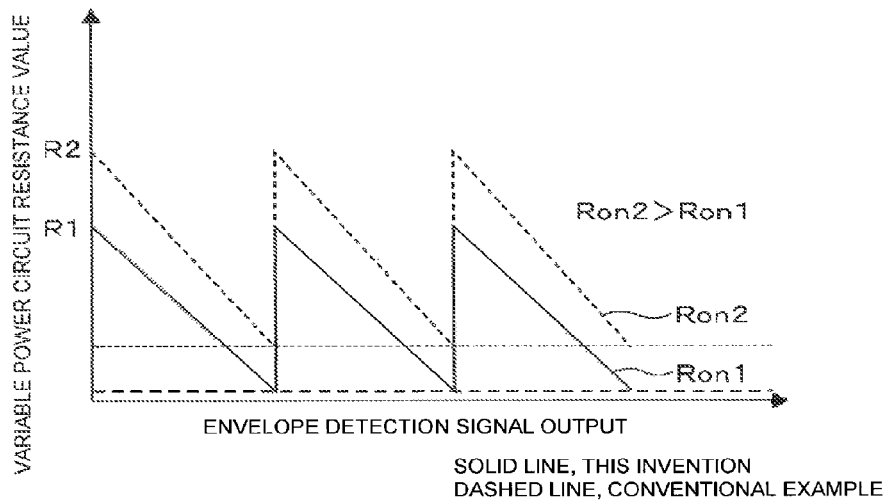
FIG. 5A is a diagram illustrating a relationship between an envelope detection signal output and a resistance value R of a variable power circuit in the first embodiment of the present invention and a conventional example.

In the present invention, with the application of the diode clamped variable power circuit, the efficiency Edc of the DC power circuit unit 120 is further improved as compared with the conventional art. FIG. 5A illustrates a relationship between an envelope detection signal output and a resistance value R of the variable power circuit. In the present invention, a resistance value of the MOS(1) in a first stage is R1 when the envelope signal level is minimum, and the resistance value is decreased more toward an increase in the envelope signal level. In the conduction state of the MOS(1) in the first stage, the resistance value becomes the minimum resistance value RON1. Subsequently, the respective resistance values of MOS(2), MOS(3), . . . MOS(n) are changed in a saw tooth shape between R1 and RON1. In the diode clamped variable power circuit according to the present invention, a plurality of power MOS transistors (1 to n) are connected in series with a drain end of the high-frequency amplifier unit 103. A voltage of Vdd/n is applied between the source and the drain of each power MOS transistor at a maximum. As an example, when it is assumed that Vdd is 100 V, and n is 10, a withstand voltage of each power MOS transistor becomes 10V. Because the withstand voltage of the diode clamped circuits in the respective stages may be smaller than Vdd, the resistance value of the variable power circuit becomes smaller. For that reason, the minimum resistance value RON1 also becomes smaller.

Thus, in the present invention, all withstand voltages of the power MOS transistors MOS(1) to MOS(n) can be set to an identical small value, and the variable power circuit 106 can be configured by the smallest Vdd/n(V). As a result, because a transistor small in withstand voltage can be used, and the on-resistance and the input capacitance are reduced, the high-frequency amplifier operable at a high frequency and having a high efficiency can be realized.

On the other hand, let us consider a case in which the plurality of power MOS transistors (1 to n) are connected in parallel to the drain end of the high-frequency amplifier unit 103, which corresponds to the example disclosed in PTL 2 as the conventional example. In this case, as indicated by a dashed line, a voltage of Vdd is applied between the source and the drain of the respective power MOS transistors. As an example, when it is assumed that Vdd is 100 V, and n is 10, a withstand voltage of each power MOS transistor becomes 100V. Because the withstand voltage of the respective power MOS transistors in the conventional example becomes higher than that in the present invention, when the envelope signal level is the minimum, the resistance value of MOS(1) in the first stage is R2, and the minimum resistance value RON2 also becomes larger.

Figure 5B:
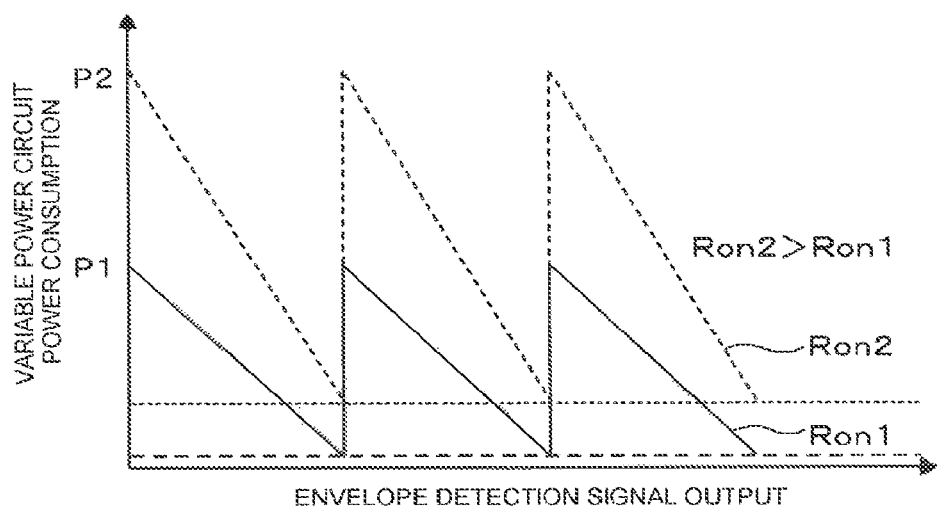
FIG. 5B is a diagram illustrating a relationship between the envelope detection signal output and a power consumption of the variable power circuit in the first embodiment of the present invention and the conventional example.

FIG. 5B illustrates a relationship between the envelope detection signal output and a power consumption of the variable power circuit. In the present invention, because the resistance value of the variable power circuit is always smaller than that in the conventional example, a power consumption P1 becomes smaller than a power consumption P2 in the conventional example. According to our research, the efficiency of the efficiency Edc is about 80% in the conventional example indicated by a dashed line in FIG. 5B whereas the efficiency of the efficiency Edc is improved to about 90% in an example of the present invention indicated by a solid line. For that reason, according to the present invention, because Eall=Edc×Erf is improved by about 10% or more as compared with the conventional example, an area of the reduced power illustrated in FIG. 4 becomes larger than that in the conventional example.

Thus, according to the present invention, there can be provided a high-frequency amplifier that maintains the high linearity and has the high efficiency for the extensive input modulated signal power.

Second Embodiment

Figure 6:
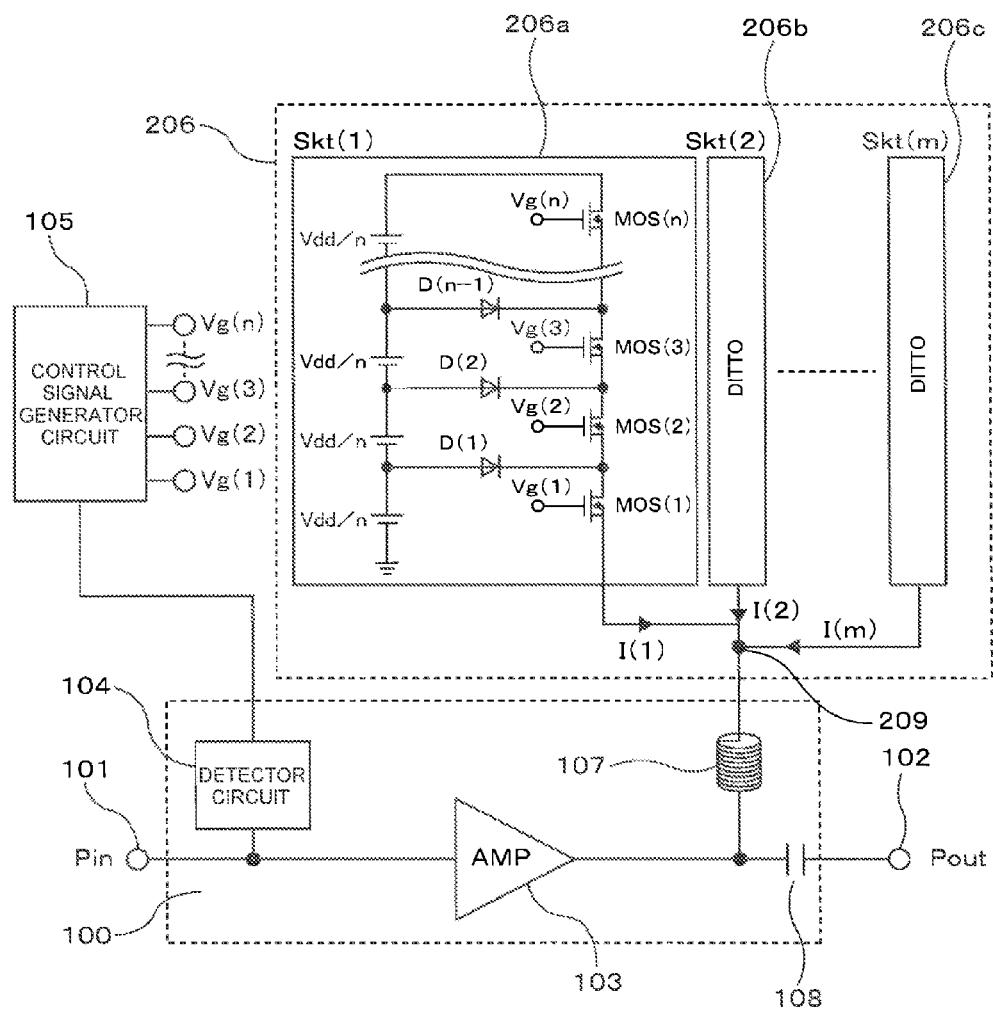
FIG. 6 is a diagram illustrating a configuration of a high-frequency amplifier according to a second embodiment of the present invention.

FIG. 6 is a diagram illustrating a configuration of a high-frequency amplifier according to a second embodiment of the present invention. The high-frequency amplifier according to this embodiment is different from that of the first embodiment in the configuration of the diode clamped variable power circuit. A diode clamped variable power circuit 206 is configured so that a diode clamped variable power circuit 206a, a diode clamped variable power circuit 206b, and a diode clamped variable power circuit 206c are connected in parallel with one another in m (m is a positive integer) number at a parallel connection point 209. A control power supply (variable current) combined at the parallel connection point 209 is applied to the high-frequency amplifier unit 103 through the choke inductor 107.

In the first embodiment, in order to increase the maximum current capacity Imax of MOS(1) to MOS(n) which are n-MOS FETs configuring the diode clamped variable power circuit 106, the devices of diodes D(1) to D(n−1), and MOS(1) to MOS(n) must be sized up. The parasitic capacitance component and the parasitic inductance component provided in the respective diodes and transistors are increased due to the size-up of the devices, resulting in a possibility that attenuation and phase deviation are generated in the high-frequency component of the envelope signal of the modulated signal wave.

As means for preventing the above drawback, in the second embodiment, the diode clamped variable power circuit 206 has a parallel connection structure of the diode clamped variable power circuits 206a, 206b, and 206c, each including the diodes and the transistors which are small in the maximum current capacity. The respective diode clamped variable power circuits are controlled by the common control voltages Vg(1) to Vg(n) of the control signal generator circuit 105. A total maximum current capacity Imax=I(1)+I(2) . . . +I(m) obtained at the parallel connection point 209 as a total of the respective outputs of the diode clamped variable power circuits 206a, 206b, and 206c can follow the high-speed envelope. The other configurations and operation of the high-frequency amplifier in this embodiment are identical with those in the first embodiment.

According to this embodiment, the plurality of diode clamped variable power circuits each having the plurality of diode clamped circuits connected to one another are connected in parallel to one another, to thereby increase the maximum current capacity Imax that can be supplied to the semiconductor amplifying element. According to this embodiment, in the high-frequency amplifier, the high linearity can be maintained for the extensive input modulated signal power, and the power efficiency can be improved. Also, the possibility that attenuation and phase deviation are generated in the high-frequency component of the envelope signal of the modulated signal wave can be reduced.

Third Embodiment

Figure 7:
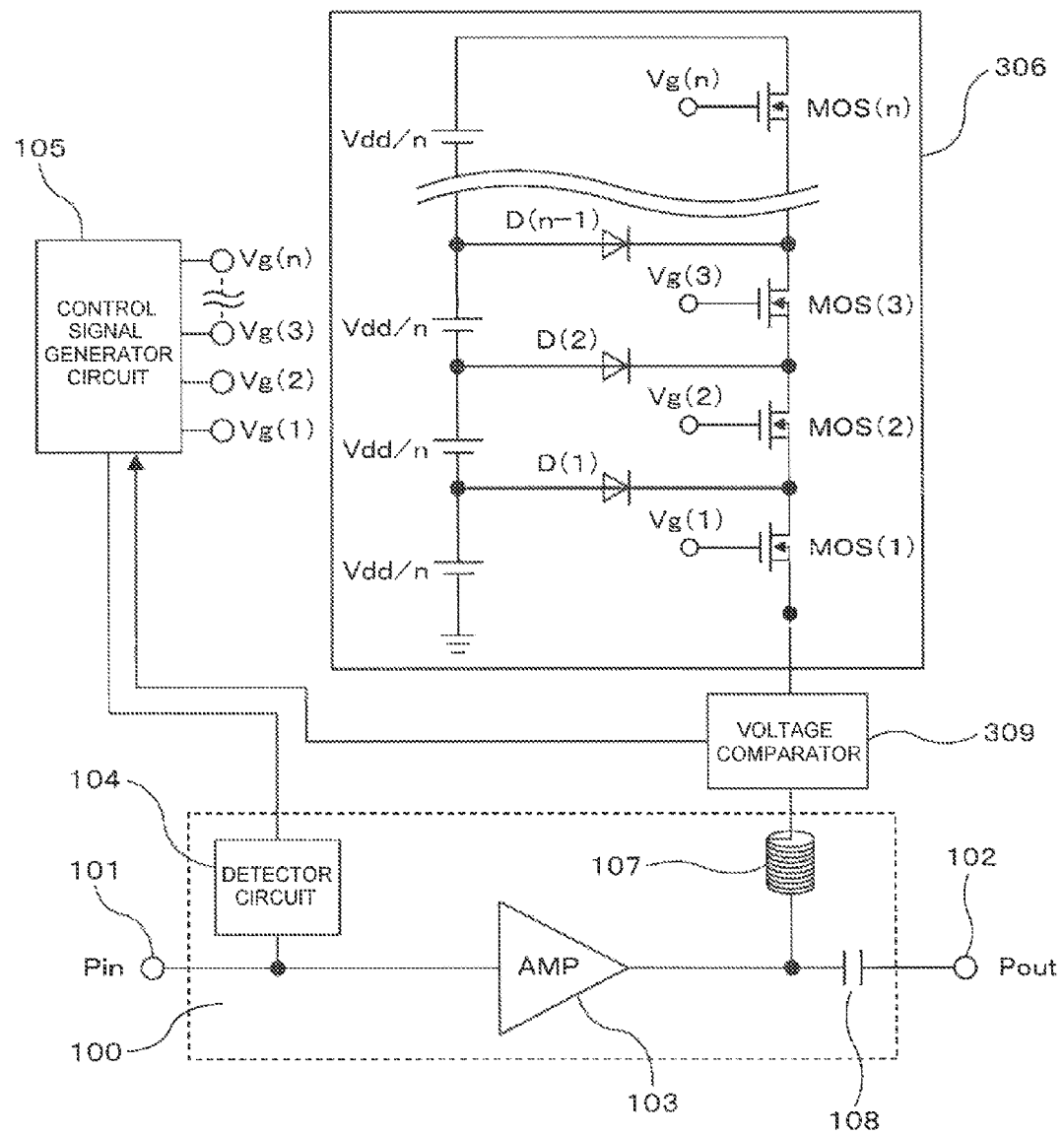
FIG. 7 is a diagram illustrating a configuration of a high-frequency amplifier according to a third embodiment of the present invention.

FIG. 7 is a diagram illustrating a configuration of a high-frequency amplifier according to a third embodiment of the present invention. In the high-frequency amplifier of this embodiment, a comparator 309 is disposed between a diode clamped variable power circuit 306 and the choke inductor 107. The comparator 309 compares an output voltage (or current) of the diode clamped variable power circuit 306 with a reference voltage (or current) developed in the control signal generator circuit 105, and feeds a difference therebetween back to the control signal generator circuit 105. The DC voltage output from the diode clamped variable power circuit is detected and fed back to the control signal generator circuit (the voltage controlled circuit or the current controlled circuit) to stabilize the DC output. Thus, the stable DC voltage (or the current) output corresponding to the control signal can be obtained. The other configurations and operation of the high-frequency amplifier according to this embodiment are identical with those in the first and second embodiments.

According to this embodiment, the operation of the high-frequency amplifier can be stabilized, the high linearity can be maintained, and the power efficiency can be improved.

Fourth Embodiment

Figure 8:
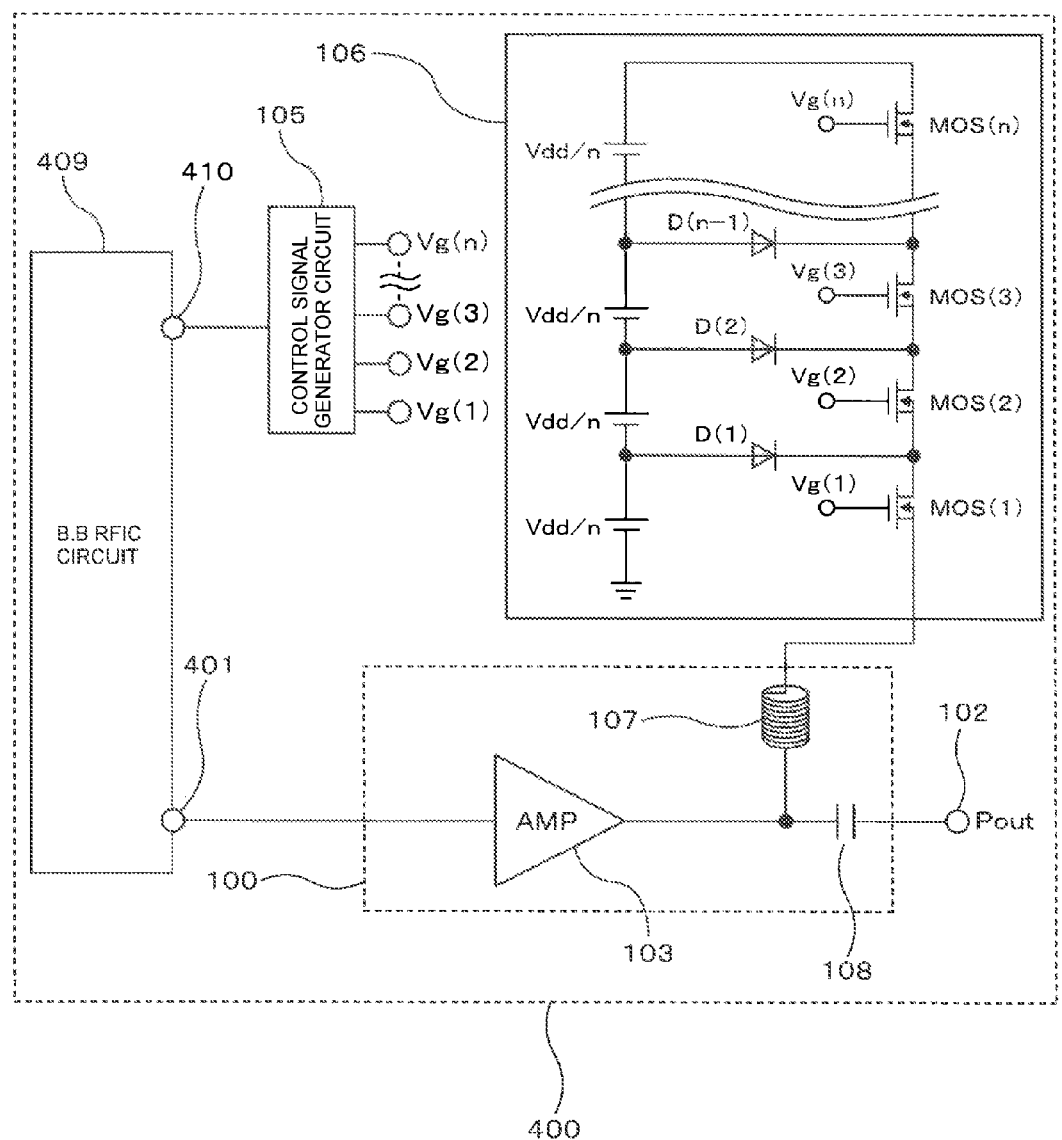
FIG. 8 is a diagram illustrating a configuration of a high-frequency amplifier and a high-frequency module using the amplifier according to a fourth embodiment of the present invention.

FIG. 8 is a diagram illustrating a configuration of a high-frequency amplifier according to a fourth embodiment of the present invention. In this embodiment, the high-frequency amplification semiconductor amplifier element 103, the control signal generator circuit 105, and the diode clamped variable power circuit 106 configuring the high-frequency amplifier are monolithically formed on a semiconductor substrate 400 as a high-frequency module together with a baseband circuit (or RFIC unit) 409. Reference numerals 401 and 409 denote output terminals of the baseband circuit 409. The control signal generator circuit 105 receives maximum output power information of a mean power of input modulated signals from the baseband circuit (or RFIC unit) 409, and variably controls a plurality of DC power supplies configuring the diode clamped variable power circuit according to the received value.

That is, instead of the signal of the envelope component detected by the detector circuit 104 in FIG. 1, a signal of the envelope component input to the control signal generator circuit 105 is acquired from the baseband circuit (or RIFC unit) 409 installed within the same transmit system 400, and in a previous stage of the high-frequency amplifier unit 103. The other configurations and operation of the high-frequency amplifier according to this embodiment are identical with those in the first to third embodiments.

According to this embodiment, the signal of the envelope component can be obtained with no detector circuit, the control signal generator circuit 105 changes the voltage or the current according to the given function on the basis of the magnitude of the envelope signal, and a diode clamped variable power circuit 406 can be operated. For that reason, the power efficiency of the high-frequency amplifier can be improved.

Fifth Embodiment

Figure 9:
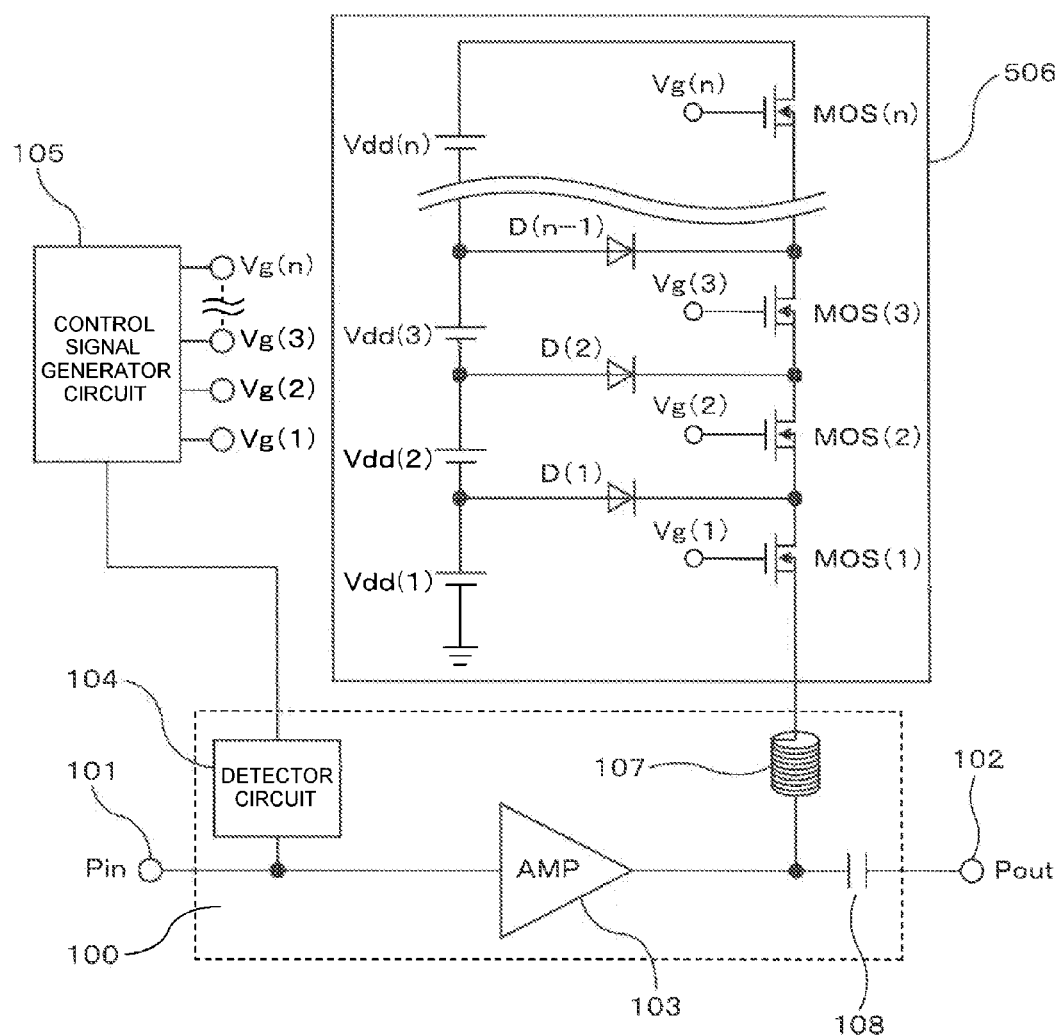
FIG. 9 is a diagram illustrating a configuration of a high-frequency amplifier according to a fifth embodiment of the present invention.

FIG. 9 is a diagram illustrating a configuration of a high-frequency amplifier according to a fifth embodiment of the present invention. In the first embodiment of the present invention, the respective DC power supply values configuring the diode clamped variable power circuit 106 are equally Vdd/n [V] (n is the number of divisions, and a positive integer), and the total of the respective DC power supplies is Vdd [V]. However, in the respective DC power supplies Vdd(1) to Vdd(n) configuring the diode clamped variable power circuit, if the total of the values is a value that can accept the maximum instantaneous power or the peak power, the respective DC supply voltage values do not always need to be equal to one another.

In this embodiment, the plurality of DC power supplies configuring the diode clamped variable power circuit are set according to the occurrence probability of the instantaneous power values of the various modulated signal waves. That is, in the fifth embodiment, the respective DC power supplies Vdd(1) to Vdd(n) configuring a diode clamped variable power circuit 506 are different from one another and the total of those values is a value that can accept the maximum instantaneous power or the peak power.

The respective DC power supplies Vdd(1) to Vdd(n) are different from one another, as a result of which the withstand voltages of the configuration members of the respective diode clamped circuits are also different from one another, and the magnitudes of the control voltages Vg(1) to Vg(4) generated by the variable signal generator circuit 105 are also different from one another. The other configurations and operation of the high-frequency amplifier according to this embodiment are identical with those in the first to fourth embodiments.

As in the fourth embodiment, the diode clamped variable power circuit 506 may be monolithically formed on a semiconductor substrate as a high-frequency module together with the baseband circuit (or RFIC unit) within the same transmit system. Also, the high-frequency module may include a receive system (not shown).

As described above, the CDMA system and the OFDM system have such a feature that the electric power of the high-frequency signal fluctuates with time, and the peak value is remarkably larger than the mean value. In particular, in the OFDM system, because carrier waves of N different frequencies are multiplexed, and frequency intervals of the respective signals are narrow, the peak power value of the multiplexed signals reaches 5 to 16 times (7 to 12 dB) of the means power value. Accordingly, in the amplifier intended to amplify the analog signal (in terms of temporally varying a level) large in the difference between the peak power value and the mean power value, a high linearity is required for the input signal in a wide range from a small signal operation time to a large signal operation time. In order to obtain the high linearity, normally, a large output back-off is taken to realize the high linearity whereby a signal demodulation error can be reduced even when the peak power is generated. However, when the large output back-off is taken, the efficiency is reduced in the high-frequency amplifier (a current consumption is increased in the high-frequency amplifier).

That is, when the output back-off corresponding to the peak power occurrence is set, most of the normal operation becomes operation in a portion (middle power time) where the output power is lower than the peak power, and the efficiency is down. Also, when the output power is small, although the occurrence probability is decreased, the occurrence probability sum is larger than the occurrence probability sum in the vicinity of the peak power, resulting in a reduction in the amplifier efficiency. As described above, the efficiency E of the ET system amplifier is expressed by a product of an efficiency E1 of the variable power circuit 106 and an efficiency E2 of the high-frequency amplifier 103, E=E1×E2.

Figure 10A:
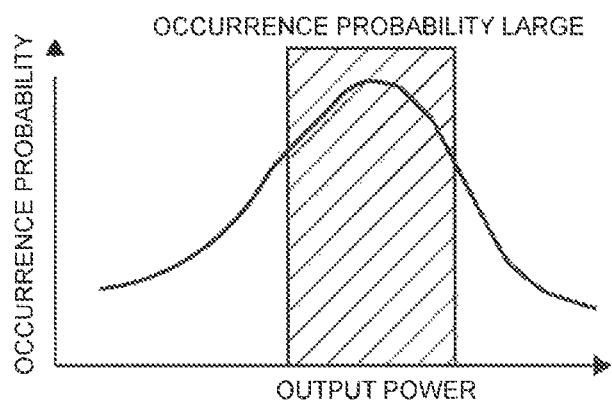
FIG. 10A is a diagram illustrating an output power and an occurrence probability in a modulated signal (instantaneous power) of a communication system applied to the fifth embodiment.

In this embodiment, with the use of the ET system taking the occurrence probability of the instantaneous power of the output modulated signal wave into account, the reduction of efficiency can be further suppressed. When the OFDM is exemplified, if the amplitude of the modulated wave has information, the occurrence probability of the instantaneous output power of the modulated signal shows the distributions illustrated in FIGS. 10A and 10B. FIG. 10A illustrates a relationship of the output power and the occurrence probability, and FIG. 10B illustrates a relationship of the detector circuit output voltage and the division number of the DC supply voltage.

In this embodiment, a change in the value of the power supply is segmentalized in an area of the output power high in the occurrence probability.

As an example, in FIG. 10A, the distribution of the DC supply voltage is so set as to segmentalize an area of the output side DC bias voltage value corresponding to the instantaneous power value high in the occurrence frequency due to the occurrence probability of the instantaneous power of the output modulated signal wave indicated by a rectangle, and a neighborhood thereof. For example, when it is assumed that the total of voltages Vdd(1) to Vdd(n) is 50 V, and the output side DC bias voltage value corresponding to the instantaneous power value at the maximum occurrence frequency point is 30V, the distribution is conducted in such a manner as Vdd(1)=10 V, Vdd(2)=10 V, Vdd(3)=5 V, Vdd(4)= 2 V, Vdd(5)=2 V, Vdd(6)=1 V, Vdd(7)=1 V, Vdd(8)=2 V, Vdd(9)=2 V, Vdd(10)=5 V, and Vdd(11)=10 V.

Figure 10B:
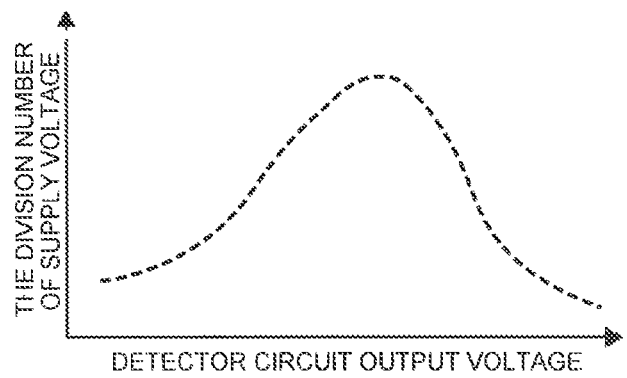
FIG. 10B is a diagram illustrating a relationship between a detector circuit output voltage and the division number of a DC supply voltage in the modulated signal (instantaneous power) of the communication system applied to the fifth embodiment.

That is, in FIG. 10B, the division number of DC supply voltage is larger in the output power area corresponding to a rectangular area of FIG. 10A.

When the difference of the values between the DC power supplies Vdd(1) to Vdd(n) becomes larger, the withstand voltage required for a specified MOS transistor becomes high. However, when the power consumption of the variable power circuit together with the occurrence probability are taken into account, the effect of Eall=Edc×Erf caused by the low withstand voltage as described in the first embodiment is not lost.

With the above configuration of the diode clamped variable power circuit 506, there can be provided the high-frequency amplifier or the high-frequency module which can be optimized for the various modulation systems, maintain the high linearity, and improve the power efficiency.

Sixth Embodiment

Figure 11:
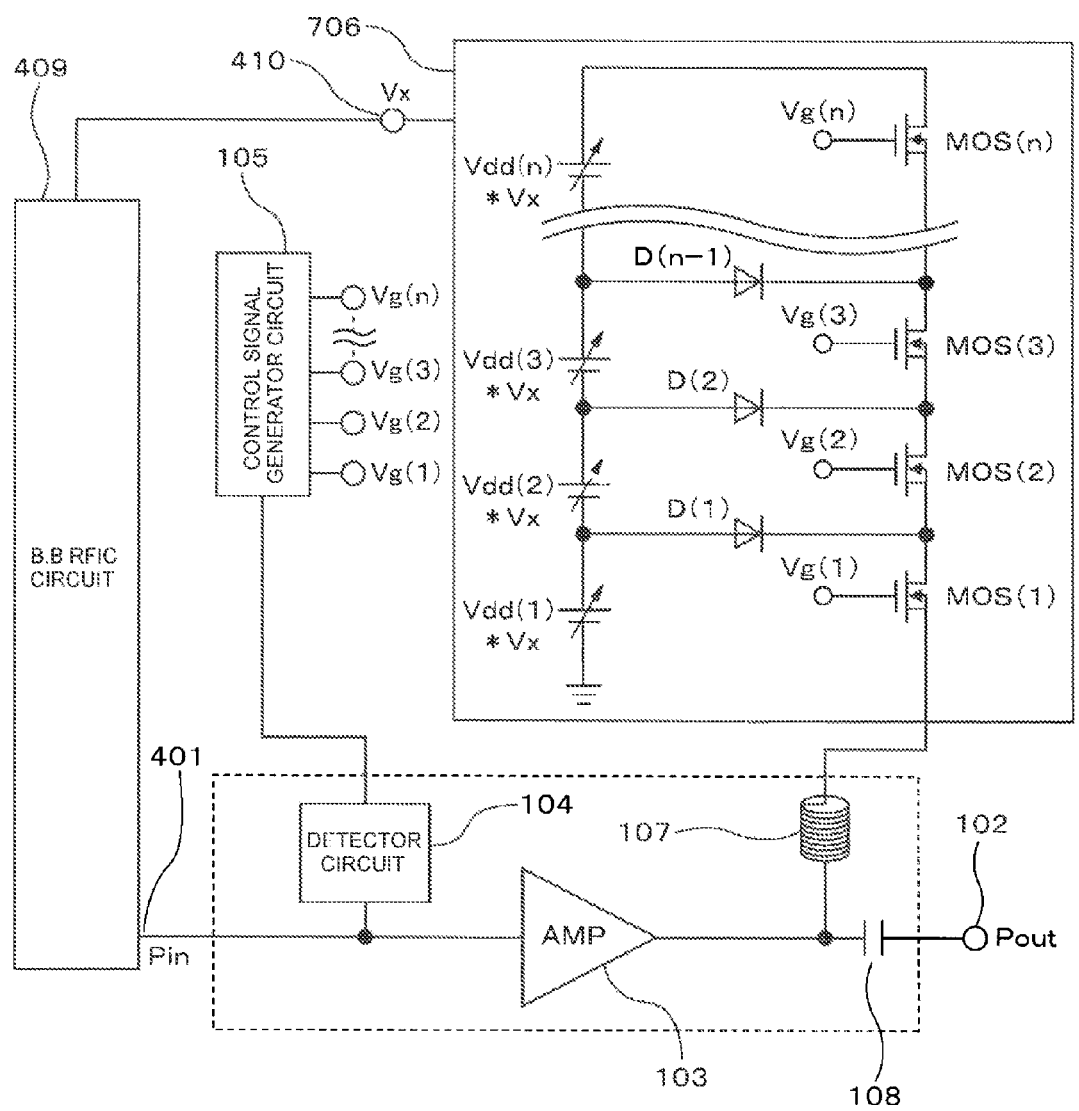
FIG. 11 is a diagram illustrating a configuration of a high-frequency amplifier and a high-frequency module using the amplifier according to a sixth embodiment of the present invention.
Figure 12:
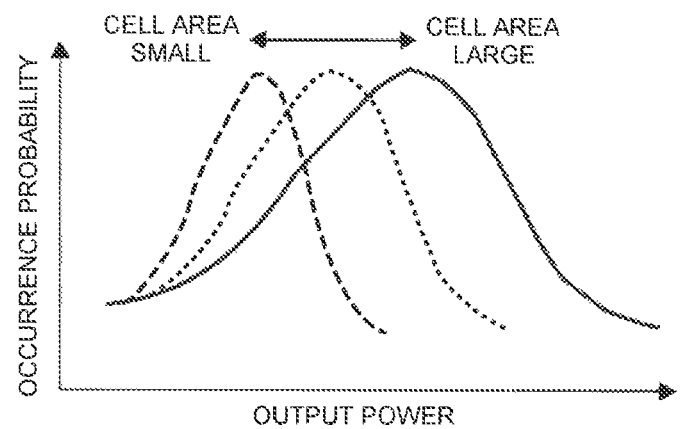
FIG. 12 is a diagram illustrating a change of the occurrence probability according to a cell area, of a modulated signal (instantaneous power) of a communication system applied to the sixth embodiment.

FIG. 11 is a diagram illustrating a configuration of a high-frequency amplifier according to a sixth embodiment of the present invention. FIG. 12 is a diagram illustrating a change in the occurrence probability of the instantaneous power of the general modulated signal according to a cell area. In this embodiment, the high-frequency amplification semiconductor amplifier element 103, the control signal generator circuit 105, and a diode clamped variable power circuit 706 configuring the high-frequency amplifier are monolithically formed on a semiconductor substrate as the high-frequency module together with the baseband circuit (or RFIC unit) 409 within the same transmit system. The high-frequency module may include a receive system (not shown).

As illustrated in FIG. 12, depending on the intended purpose of the high-frequency amplifier, the maximum instantaneous power or the peak power may be changed according to the various communication systems or the cell area that covers the base station.

In the first embodiment, the respective DC power supply values configuring the diode clamped variable power circuit 106 are equally Vdd/n [V] (n is the number of divisions, and a positive integer), and the total of the respective DC power supplies is Vdd [V].

On the contrary, in the sixth embodiment, even in the status illustrated in FIG. 12, in order that the maximum power efficiency can be obtained, the total of the respective DC power supply Vdd(1) to Vdd(n) values configuring the diode clamped variable power circuit 706 is set to a value corresponding to those respective communication systems or the cell area. The instantaneous power value which is the maximum occurrence frequency in the occurrence probability of the instantaneous power is also changed in the same manner as that illustrated in FIG. 12. For that reason, a variable voltage signal Vx corresponding to the various communication systems or the cell area that covers the base station is acquired from the baseband circuit (or RFIC unit) 409 disposed in the front stage of the high-frequency amplifier unit 103, and input the signal to a variable voltage signal input terminal 410, and the respective Vdd(1) to Vdd(n) are changed according to the same coefficient Vx. That is, the respective DC power supplies are of the variable voltage system, and the voltage value is controlled to Vdd(1)×Vx to Vdd(n)×Vx. The respective DC power supplies Vdd(1) to Vdd(n) are changed with the results that the withstand voltages of the configuration members of the respective diode clamped circuits need to correspond to the maximum value of Vx. Even at the maximum Vdd(n)×Vx×d of the DC power supply, the operation is conducted on a lower side of the output back-off to obtain an extremely high linearity. The other configurations and operation of the high-frequency amplifier according to this embodiment are identical with those in the first to fifth embodiments.

Figure 13:
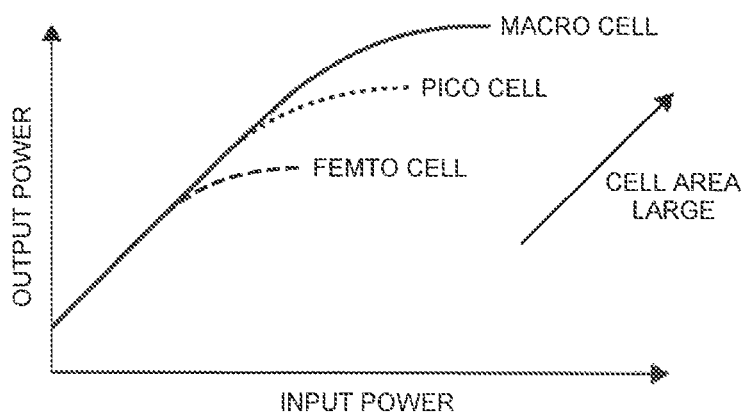
FIG. 13 is a diagram illustrating a relationship between an input power and an output power of the high-frequency amplifier for each of various communication systems applicable by the sixth embodiment.

FIG. 13 illustrates a relationship between the input power and the output power of the high-frequency amplifier for each of various communication systems. The cell area is increased in the order of a femto cell, a pico cell, and a macro cell, as a result of which ranges of the input power and the output power necessary for operation are also enlarged. According to this embodiment, the DC power supply can be made variable on the basis of the information on the communication system acquired from the baseband circuit (or RFIC unit) whereby the instantaneous power value can comply with the respective systems, and can be optimized for the various communication systems, or the cell area of the base station, and the power efficiency can be improved.

Seventh Embodiment

Figure 14:
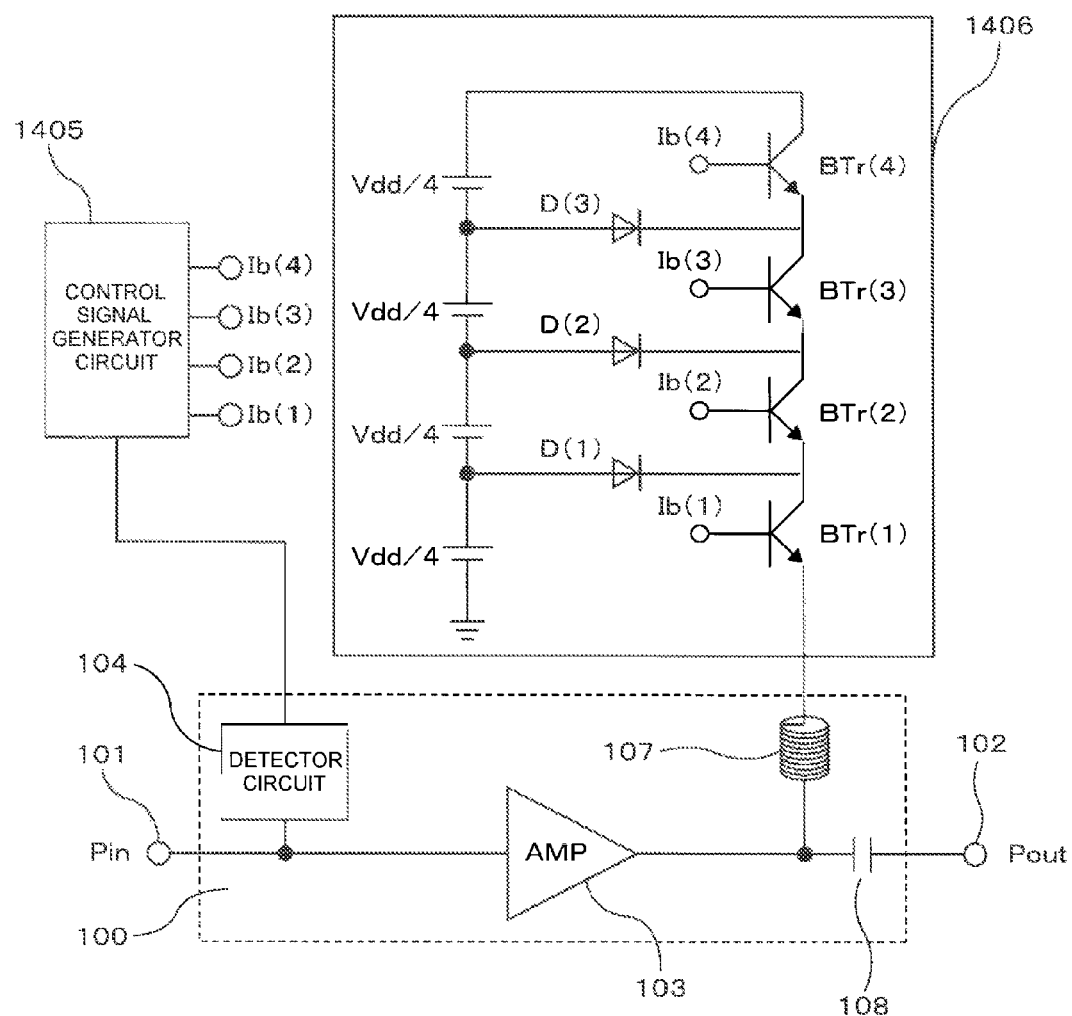
FIG. 14 is a diagram illustrating a configuration of a high-frequency amplifier according to a seventh embodiment of the present invention.

FIG. 14 is a diagram illustrating a configuration of a high-frequency amplifier according to a seventh embodiment of the present invention. In this embodiment, MOS(1) to MOS (n) of the transistors n-MOS FET configuring a diode clamped variable power circuit 1406 in any one of the first to sixth embodiments are replaced with bipolar transistors BT1 (1) to BTr(n). In the diode clamped variable power circuit of this embodiment, a plurality of power bipolar transistors BTr (1) to BTr(n) are connected in series with the DC supply terminal of the high-frequency amplifier unit 103, and a voltage of Vdd/n is applied between the collectors and the emitters of the respective power bipolar transistors BT1(1) to BTr(n) at a maximum. The other configurations and operation of the high-frequency amplifier according to this embodiment are identical with those in the first to sixth embodiments.

A current based on the magnitude of the envelope signal which has been changed according to the given function is input from the control signal generator circuit 1405 to the bases Ib(1) to Ib(n) of the respective bipolar transistors. Even if the transistors used in the clamped circuit in the respective stages are configured by the bipolar transistors, the high linearity can be maintained, and the power efficiency can be improved as in the first to sixth embodiments.

The transistor in each of the diode clamped circuits in the first to seventh embodiments may be configured by one transistor, or a plurality of transistors connected in series or connected in parallel.

Eight Embodiment

Figure 15:
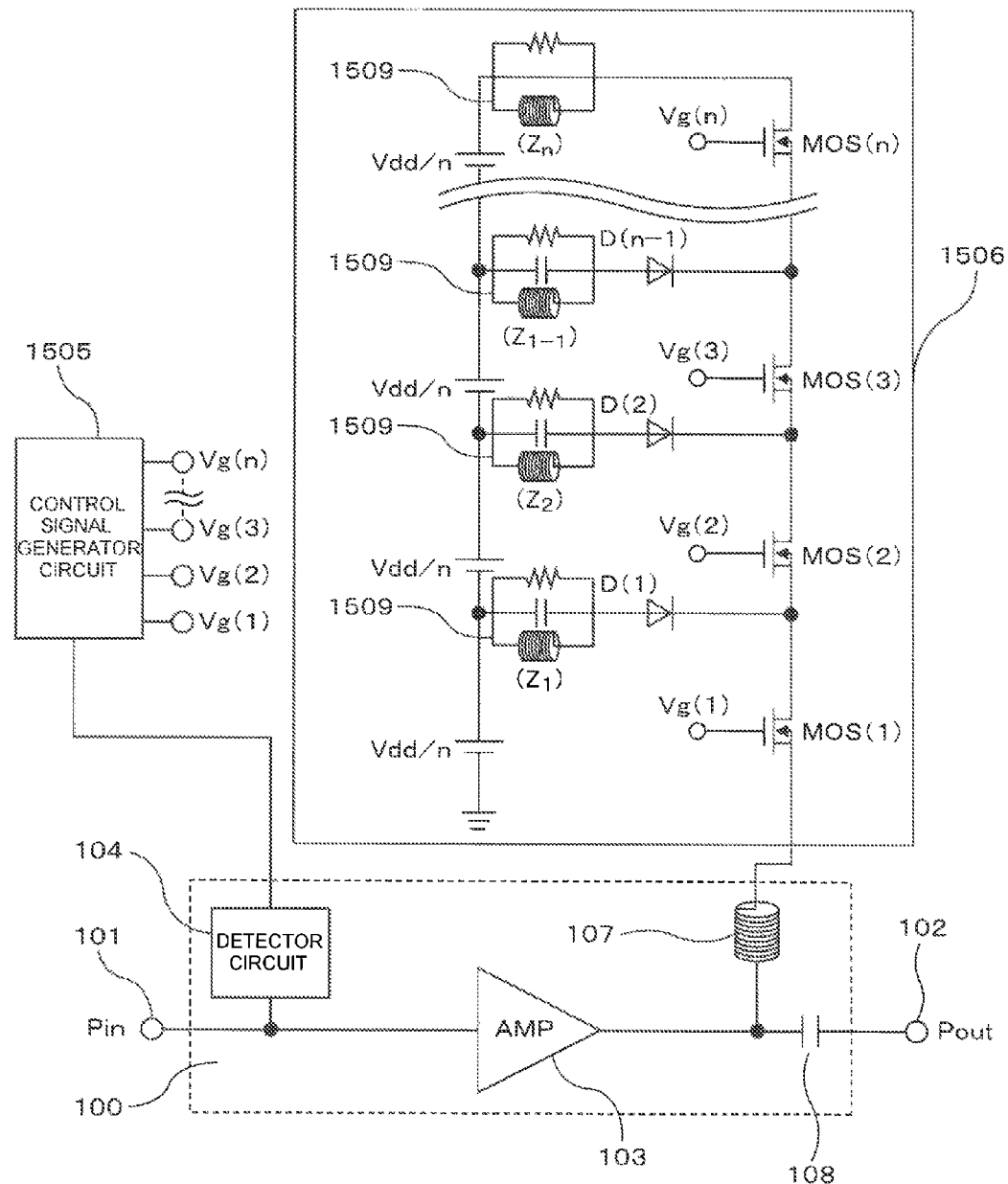
FIG. 15 is a diagram illustrating a configuration of a high-frequency amplifier according to an eighth embodiment of the present invention.

FIG. 15 is a diagram illustrating a configuration of a high-frequency amplifier according to an eighth embodiment of the present invention. In this embodiment, in a diode clamped variable power circuit 1506, at least one of a resistance element, a capacitance element, and a reactance element for adjusting an impedance Z is connected to each of the diode clamped circuits including diodes D (1 to (n−1)), the power MOS transistors (1 to n), and the DC power supply Vdd/n. Then, $Z_n = R_n + j \times n$ is adjusted for each stage n of the diode clamped circuits.

The other configurations and operation of the high-frequency amplifier according to this embodiment are identical with those in the first to seventh embodiments. According to this embodiment, the operation of the high-frequency amplifier can be stabilized, the high linearity can be maintained, and the power efficiency can be improved.

Ninth Embodiment

A ninth embodiment of the present invention provides a base station wireless machine or a mobile wireless machine using the high-frequency amplifier described in the first to eighth embodiments, or the high-frequency module described in the fourth to sixth embodiments as a transmit system. According to this embodiment, the high-frequency amplifier according to the above respective embodiments can also accept, as the amplifier that amplifies the high-frequency analog signal of the transmit system, the wireless communication system employing not only the GSM system using the saturated amplifier, but also a CDMA system and an OFDM (orthogonal frequency division multiplexing) system using the high-linear amplifier, and extended systems thereof. That is, this embodiment contributes to an enhancement in the efficiency of the high-frequency amplifier, the high-frequency module, and the base station/mobile wireless machine using the high-frequency amplifier or the high-frequency module in a wide dynamic range.

Tenth Embodiment

Figure 16A:
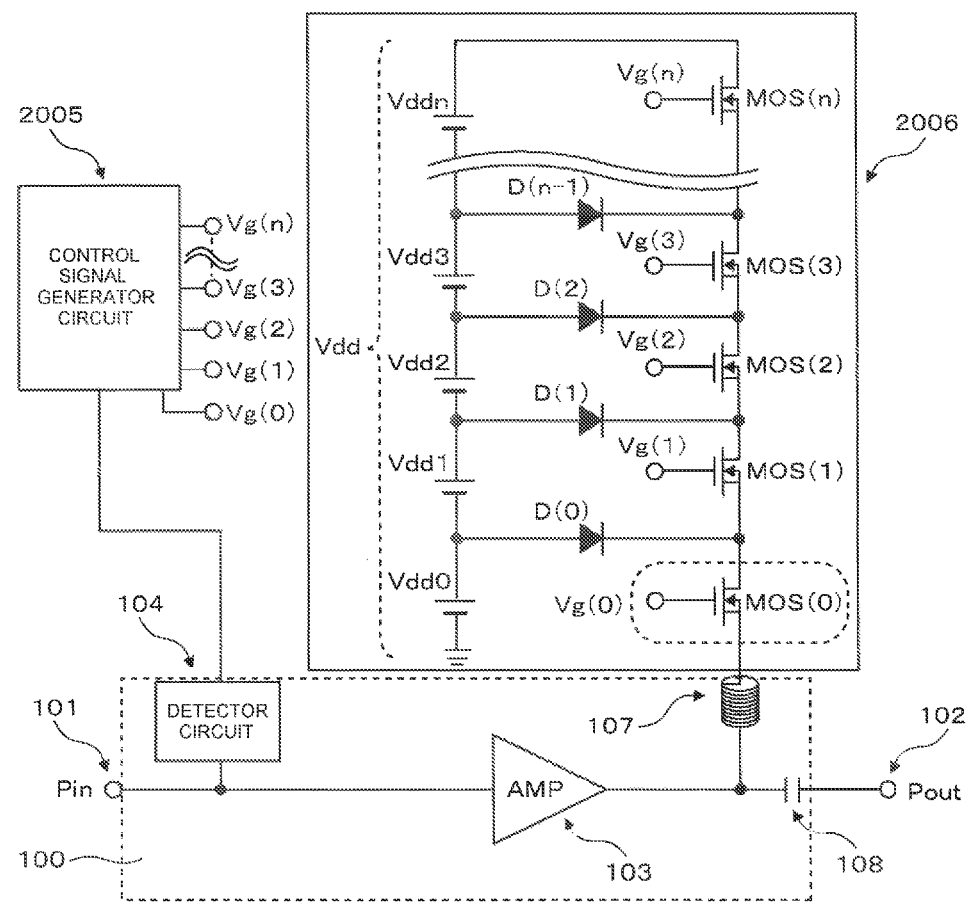
FIG. 16A is a diagram illustrating a configuration of a high-frequency amplifier according to a tenth embodiment of the present invention.

FIG. 16A is a diagram illustrating a configuration of a high-frequency amplifier according to a tenth embodiment of the present invention.

The high-frequency amplifier unit 103 according to this embodiment includes at least one-stage semiconductor amplifying element that amplifies and outputs an input modulated wave signal, and input side and output side bias circuits for applying the DC bias to the semiconductor amplifying element in each stage.

The modulated wave signal Pin input from the input terminal 101 is amplified by the high-frequency amplifier unit 103, passes through the DC cut capacitor 108 configuring the final stage output side bias circuit, and is output from the output terminal 102 as an output signal Pout. On the other hand, the modulated wave signal Pin input from the input terminal 101 is detected by the detector circuit 104 to become only an envelope component, which is input to an offset voltage/current controlled circuit 2005 that can change the control voltages Vg (or the current value) according to a given function (linear function or nonlinear function) on the basis of the magnitude of the envelope signal.

A diode clamped variable power circuit 2006 includes (n−1) diode clamped circuits each having the diode D (0 to (n−1)), the power MOS transistor (0 to n), and the DC power supply Vdd. The DC power supply Vdd is configured by Vdd0 to Vddn obtained by dividing a value of the DC power supply Vdd into n pieces. The diode clamped circuit in the first stage includes the diode D(0), the power MOS transistor (0), and the DC power supply Vdd0. A control voltage value Vg0 is applied to the power MOS transistor (0).

The control voltage values Vg1 to Vgn generated by the offset voltage/current controlled circuit 2005 change with respect to the envelope signal, for example, according to a linear function. Also, the control voltage value Vg (or current value) generated by the offset voltage/current controlled circuit 2005 has a fixed lower limit value Vg0 different depending on the communication system, with an offset. Therefore, the control voltage value Vg does not become lower than the fixed offset value Vg0.

Figure 16B:
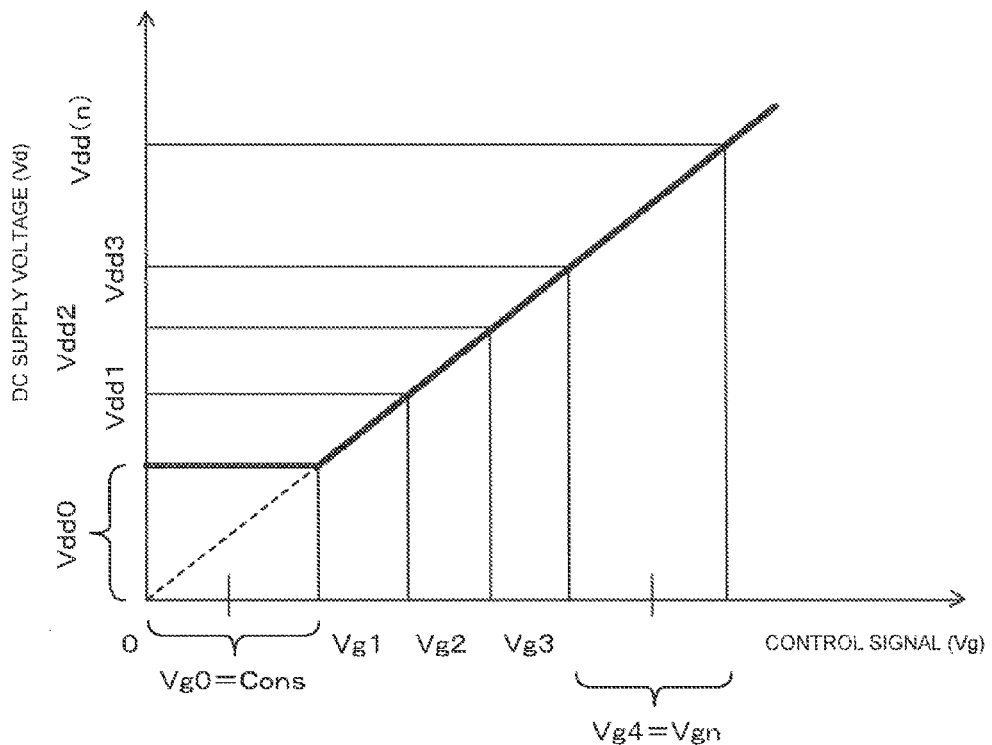
FIG. 16B is a diagram illustrating a relationship between a control signal and a DC supply voltage according to the tenth embodiment of the present invention.

FIG. 16B is a diagram illustrating a relationship between the control signal Vg and the DC supply voltage Vdd according to the tenth embodiment. In an area corresponding to an operating range of only the MOS transistor (0) in the first stage, the DC voltage value corresponding to the offset value Vg0 becomes a given value of Vdd0 where the MOS transistor (0) can always turn on. That is, a DC voltage output Vd of the diode clamped variable power circuit 2006 has a flat characteristic of Vdd0 in the operating state of MOS(0), and a voltage value changed according to the linear function in correspondence with the magnitude of the control voltage Vg in the operating states of MOS(1) to MOS(n), on the basis of the magnitude of the control voltage Vg. Thus, if the offset value Vg0 of the control voltage is equivalent to the voltage value in which MOS(0) in the first stage in the diode clamped variable power circuit 2006 can always turn on, the voltage of the minimum voltage value Vdd0 is always applied to the high-frequency amplifier unit 103 through the choke inductor 107.

Also, in this embodiment, the choke inductor 107 and the DC cut capacitor 108 which are the final stage output side bias circuit are arranged outside the high-frequency amplifier unit 103. However, the same operation is obtained even if the choke inductor 107 and the DC cut capacitor 108 are disposed within the high-frequency amplifier unit 103.

The MOS transistors in the first stage and the final stage are low in the use frequency, and therefore share a wide area of, for example, twice or more, in the MOS transistor of an intermediate area, as illustrated in FIG. 16B. This will be described in detail below.

Subsequently, the operation and effects of the high-frequency amplifier according to the tenth embodiment will be described.

Figure 17:
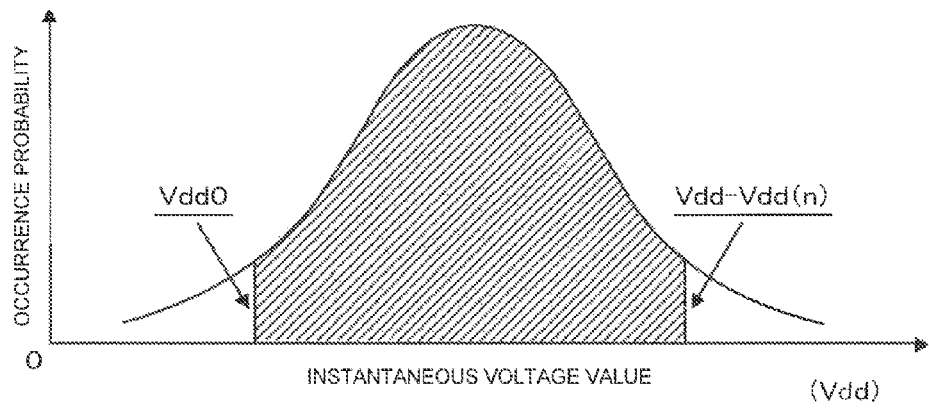
FIG. 17 is a diagram illustrating the occurrence probability of the instantaneous power of the modulated signal input to the high-frequency amplifier.
Figure 18:
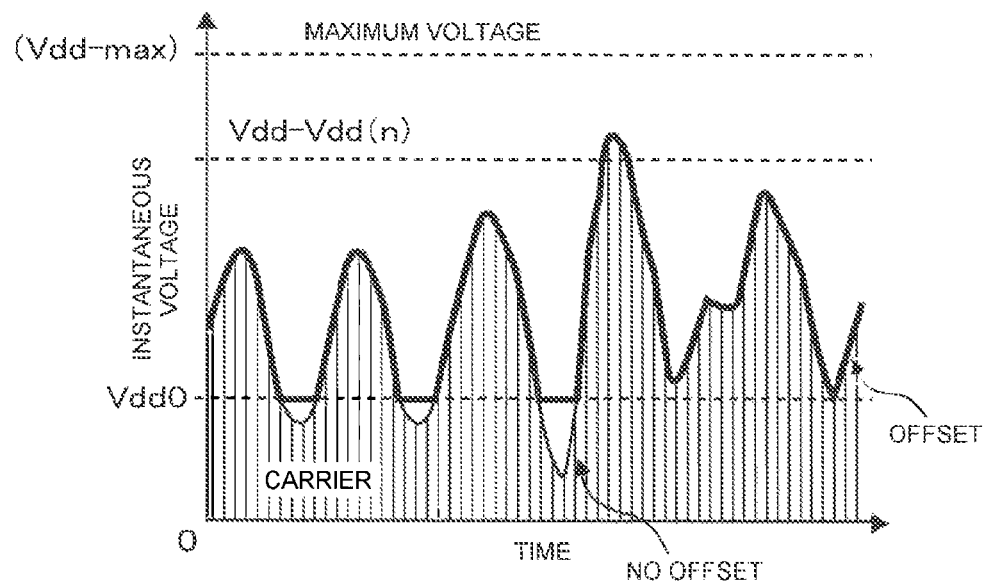
FIG. 18 is a diagram illustrating an output voltage waveform of the DC power supply when an offset value is present or absent.

FIG. 17 is a diagram illustrating the occurrence probability of the instantaneous power of the general modulated signal input to the high-frequency amplifier. The axis of abscissa represents an instantaneous voltage value, and the axis of ordinate represents the occurrence probability. FIG. 18 is a diagram illustrating an output voltage waveform of the DC power supply when an offset value is present or absent.

As illustrated in FIG. 18, when the offset value is present, it is found that the output voltage waveform has a given value in the lower limit value Vdd0. In this case, because a given voltage is always applied to the high-frequency amplifier unit 103, there is a risk that the power efficiency and the overall amplifier efficiency are reduced. However, taking into account a case in which the modulated wave having the occurrence probability of the instantaneous voltage value is input as illustrated in FIG. 17, the occurrence probability of Vdd0 or lower is extremely low, and is lower than about 5 to 10% of the overall occurrence probability. For that reason, even if the efficiency is reduced in this portion, the overall efficiency reduction of the high-frequency amplifier unit 103 within a given time is extremely low.

Likewise, the occurrence probability of the high voltage of the maximum voltage Vdd or the neighborhood thereof is extremely low in a high voltage portion of the instantaneous voltage value of FIG. 17, that is, an area of the power supply (Vdd0-Vdd(n)) in the uppermost stage. Therefore, a value (sharing area) of the supply voltage Vdd(n) in the uppermost stage can be increased.

When the sharing areas of the MOS transistors in the first stage and the final stage are widened, the total number of MOS transistors configuring the diode clamped variable power circuit 2006, and therefore, the total number of the diode clamped circuits can be decreased to reduce the costs.

On the other hand, in an intermediate area where the occurrence probability of the instantaneous voltage value is high, the sharing area of the MOS transistor is relatively narrowed as compared with the surrounding area, thereby being capable of following the high-speed envelope and improving the power efficiency. That is, a lower potential is offset, and the sharing area of the power supply in the final stage is widened to make the MOS transistor small in the withstand voltage in the intermediate area available. Because the on-resistance and the input capacity of the MOS transistor in the intermediate area are kept low, the high-frequency amplifier operable at the high frequency and having the high efficiency can be realized. In this way, there can be provided the high-frequency amplifier that is low in cost, follows the high-speed envelope, and improves the power efficiency as a whole.

If the above-mentioned offset value is equivalent to the voltage value in which MOS(0) in the diode clamped variable power circuit 2006 can always turn on, MOS(0) can be removed. As a result, the costs of the high-frequency amplifier can be reduced.

Eleventh Embodiment

An eleventh embodiment of the present invention will be described with reference to FIGS. 19A and 19B.

Figure 19A:
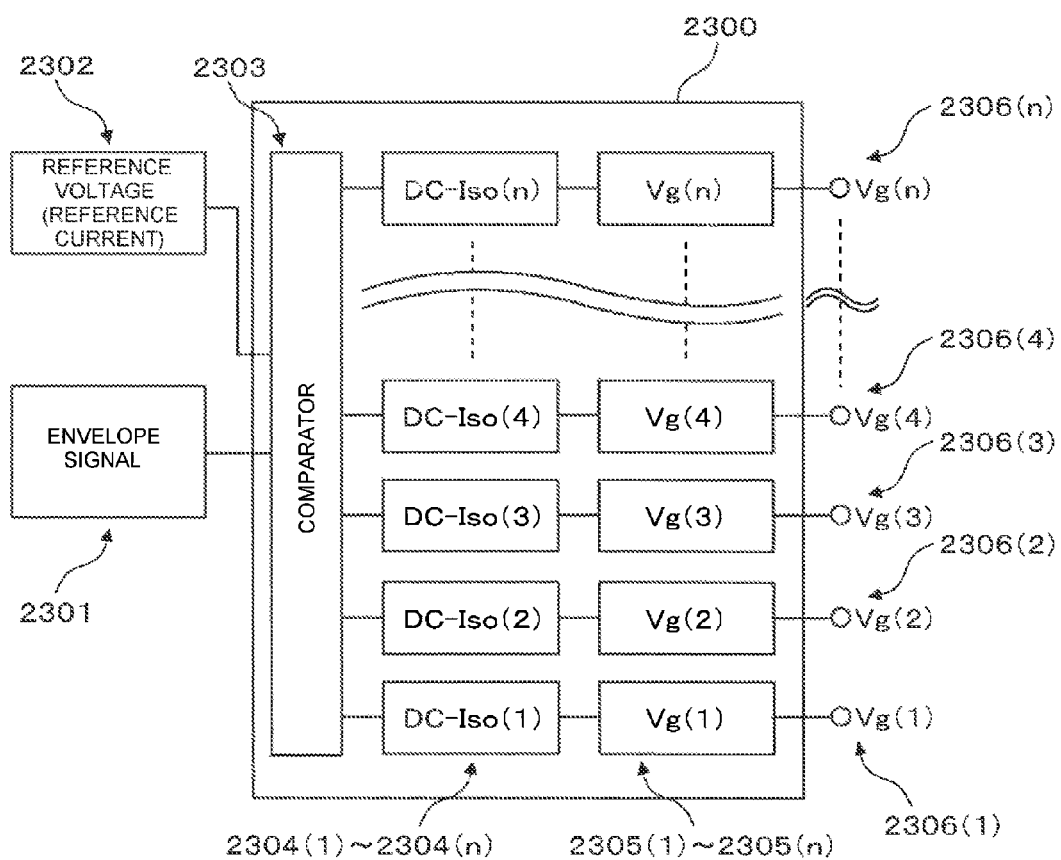
FIG. 19A is a diagram illustrating a configuration of a comparative voltage/current control circuit according to an eleventh embodiment of the present invention.

FIG. 19A illustrates a configuration of a comparative voltage/current control circuit according to the eleventh embodiment of the present invention.

In the voltage/current control circuits in the respective embodiments described above, the voltage or current value is output according to the analog function in response to the input envelope signal. On the contrary, in a comparative voltage/current control circuit 2300 according to this embodiment, an envelope signal 2301 and a reference voltage/reference current 2302 are compared by a comparator 2303, and if the envelope signal 2301 is equal to or larger than the reference voltage or the reference current, a difference therebetween is output and transmitted as an analog DC signal. As usual, the comparators of the same number as the number of output terminals are disposed within the comparator 2303, and the reference voltages or the reference currents of the same number as the number of output terminals are provided in the reference voltage/reference current 2302.

That is, in an example of FIG. 19A, n reference voltages or n reference current values are provided within the reference voltage/reference current 2302, and n comparators are disposed within the comparator 2303. In this example, each isolation circuit 2304 is provided for isolating DC potential components provided in both of a transistor driver circuit 2305 and the comparator 2303 in n difference signals output from the comparator 2303. The isolation circuit 2304 transmits only the analog DC signal of the difference output from the comparator 2303, and does not transmit the DC potential.

As an example, the isolation circuits 2304 (1 to n) can be realized by using a photocoupler or a digital isolator. In this manner, signals for driving the respective transistors provided in diode clamped variable power circuits 2306 (1 to n) are generated in the transistor driver circuits 2305 (1 to n), and can be output from the transistor drive signal output terminals Vg (1 to n).

Figure 19B:
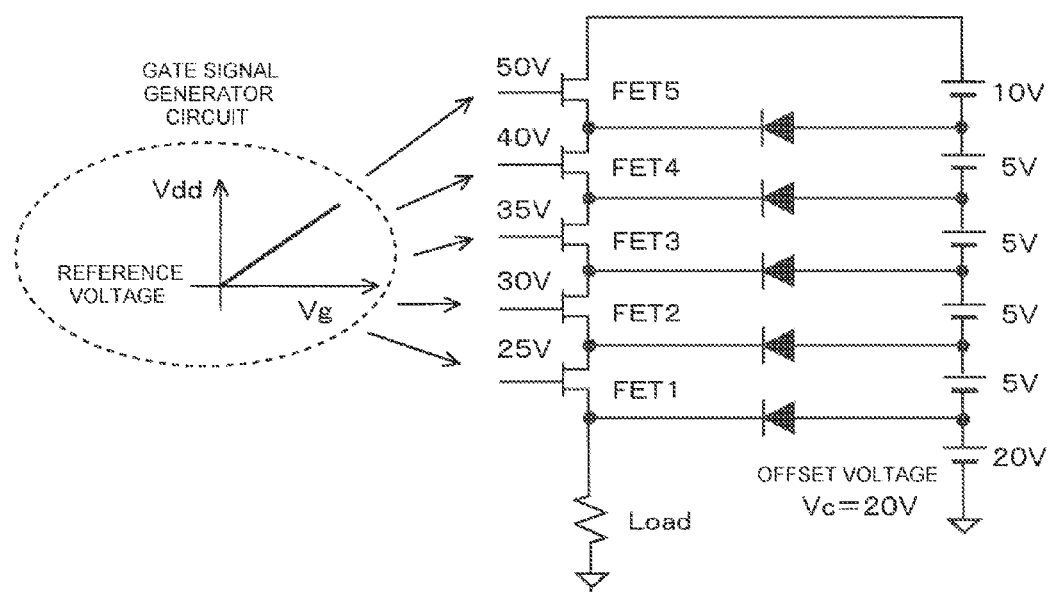
FIG. 19B is a diagram illustrating a relationship between a control signal and a DC supply voltage according to the eleventh embodiment of the present invention.

FIG. 19B illustrates an example of a relationship between the control signal and the DC supply voltage according to the eleventh embodiment. In the example of FIG. 19B, the diode clamped variable power circuits 2306 are identical in configuration with the diode clamped variable power circuit 2006 in the tenth embodiment. As an example, the voltage Vdd0 of the power supply in the first stage is 20 V, the supply voltage Vdd (n) in the final stage is 10 V, and the voltage values Vdd2 to Vdd4 of the respective supply voltages in the intermediate stages are 5 V. Also, the sharing areas of the MOS transistors in the first stage and the final stage which are small in the use frequency are widened, the reference voltage of the MOS transistor (FET1) in the first stage is 25 V, and the reference voltage in the MOS transistor (FET 5) in the final stage is 50 V. On the other hand, the MOS transistors (FET2 to FET4) in the intermediate area are set at the reference voltages increased at 5 V intervals. In the comparative voltage/current control circuit 2300, when the envelope signal 2301 exceeds the reference voltages 25 V, 30 V, 35 V, 40 V, and 50 V of the respective MOS transistor FETs (1 to 5), the respective gate signals Vd corresponding to the difference signals between the respective reference voltages and the voltages of the envelope signals are output.

Twelfth Embodiment

Figure 20:
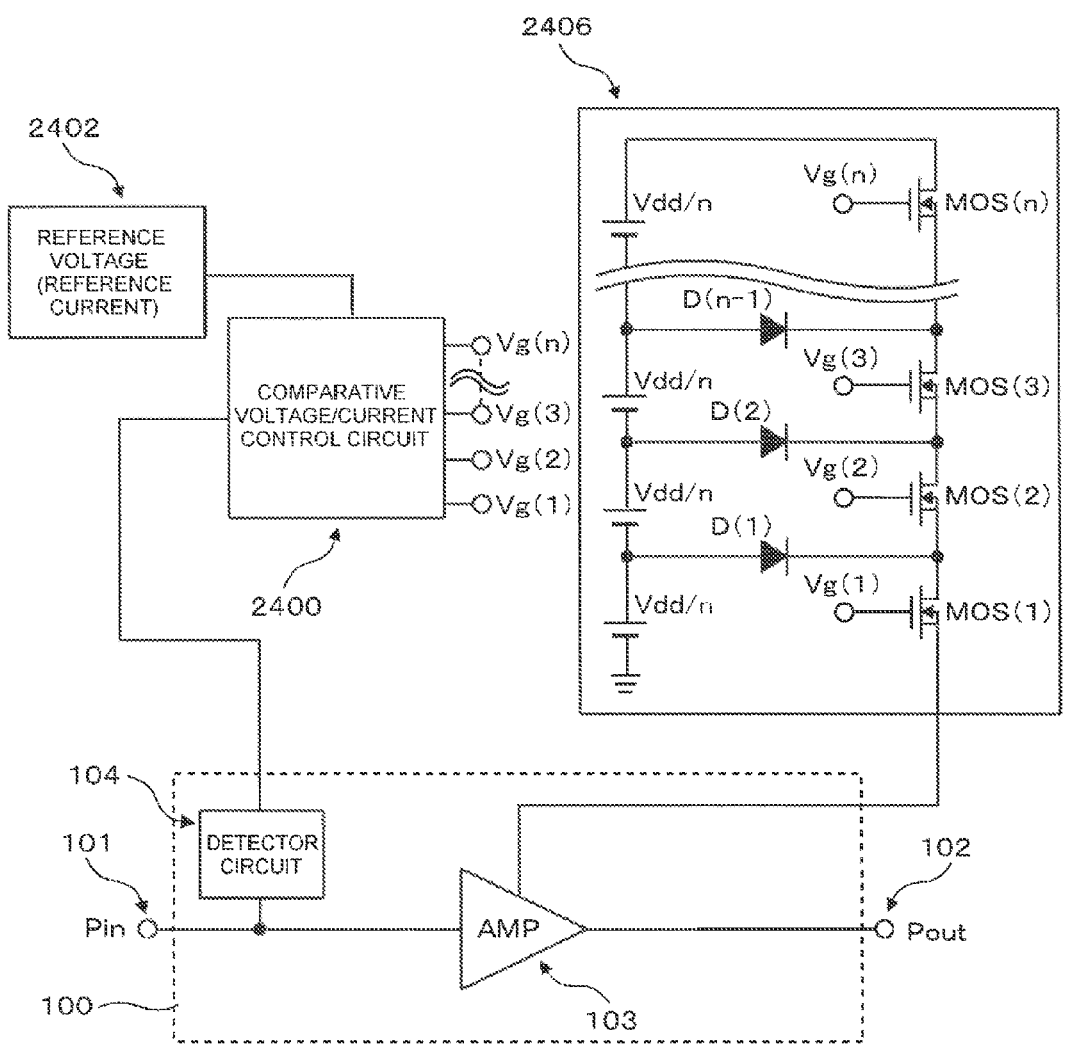
FIG. 20 is a diagram illustrating a configuration of a high-frequency amplifier according to a twelfth embodiment of the present invention.
Figure 21:
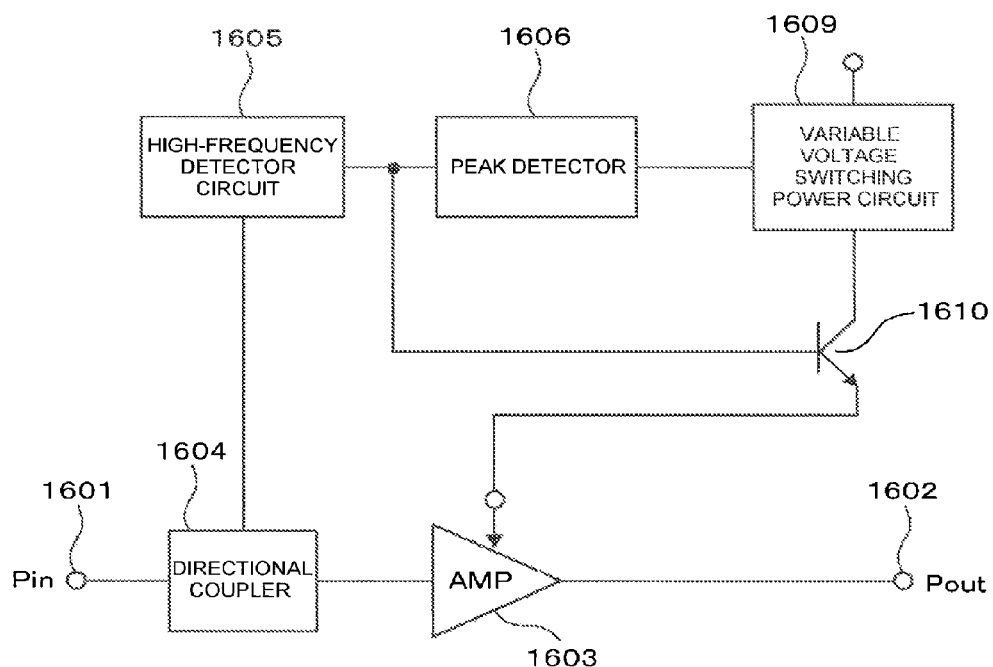
FIG. 21 is a diagram illustrating a configuration example of a high-frequency amplifier in a conventional example.
Figure 22:
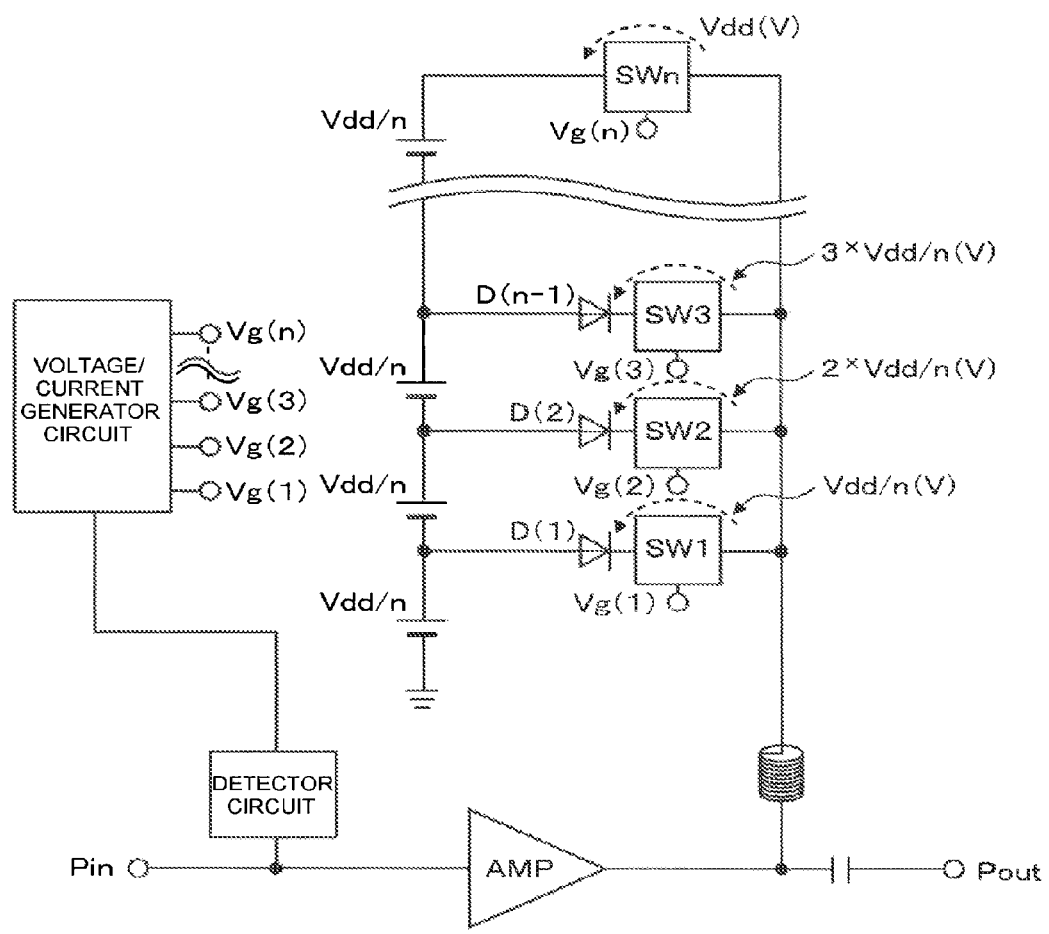
FIG. 22 is a diagram illustrating a relationship between a high-frequency amplifier and a supply voltage applied to the amplifier in another conventional example.

FIG. 20 is a diagram illustrating a configuration of a high-frequency amplifier according to a twelfth embodiment of the present invention. In the high-frequency amplifier of this embodiment, the control signal generator circuit 105 according to the first embodiment is replaced with the comparative voltage/current control circuit 2300 of FIG. 19. The envelope signal and a reference voltage/reference current 2402 are compared by a comparator of a comparative voltage/current control circuit 2400, and only the analog DC signal of the difference is transmitted to a diode clamped variable power circuit 2406 to control the supply voltage of the high-frequency amplifier 103.

As a result, there can be provided a high-frequency amplifier that is low in cost, follows the high-speed envelope, and improves the power efficiency as a whole.

Even if the comparative voltage/current control circuit illustrated in FIG. 19A is replaced with the voltage/current control circuit in the other embodiments already described, and implemented, the same advantages are obtained.

LIST OF REFERENCE SIGNS 100, high frequency amplifier circuit unit
101, 401, 1601, input terminal
102, 1602, output terminal
103, 1603, high-frequency amplifier unit
104, detector circuit
105, 1405, 1505, control signal generator circuit
106, 206, (206a, 206b, 206c), 306, 506, 706, 1406, diode clamped variable power circuit
107, choke inductor
108, DC cut capacitor
120, DC power circuit unit
209, parallel connection point
309, comparator
409, 709, baseband circuit or RFIC unit
410, envelope signal output terminal
710, variable voltage signal input terminal
1005, variable signal generator circuit
1006, variable power circuit
1604, directional coupler
1606, peak detector
1609, variable voltage switching power circuit
1610, current controlled variable resistor
2005, offset voltage/current controlled circuit
2006, diode clamped variable power circuit
2008, DC cut capacitor
2301, envelope signal
2302, 2402, reference voltage/reference current
2303, comparator
2304, isolation circuit
2305, transistor driver circuit
2306, transistor driver signal output terminal
2300, 2400, comparative voltage/current control circuit

The invention claimed is:

1. A high-frequency amplifier having a high-frequency amplifying unit that amplifies and outputs a modulated analog signal, the high-frequency amplifier comprising:
   an envelope signal acquisition unit for acquiring an envelope signal of the modulated analog signal;
   a control signal generator circuit that generates a control signal; and
   a diode clamped variable power circuit that is connected to a supply terminal of the high-frequency amplifying unit, and functions as a power circuit of the high-frequency amplifying unit,
   wherein the diode clamped variable power circuit includes a plurality of diode clamped circuits each having a DC power supply, a diode, and a power transistor,
   wherein each of the diode clamped circuits has an output terminal that outputs a voltage of the DC power supply through the diode,
   wherein the diode clamped variable power circuit is structured to stack the clamped circuits in a multistage manner, and the plurality of diode clamped circuits are connected in a multistage manner through the respective output terminals so that the plurality of power transistors are connected in series with the supply terminal,
   wherein the DC power supplies corresponding to the respective power transistors are connected in series with one another in a multistage manner,
   wherein the control signal generator circuit generates the control signal that is changed according to a linear function on the basis of a magnitude of the envelope signal, and
   wherein the power transistor of each of the diode clamped circuits is controlled according to the control signal which is changed according to the linear function, individually, to change the supply voltage of the high-frequency amplifying unit according to the magnitude of the modulated analog signal.

2. The high-frequency amplifier according to claim 1,
   wherein the diode of each of the diode clamped circuits connects the DC power supply and the power transistor in a corresponding stage,
   wherein the clamped circuit in an uppermost stage has no diode, and
   wherein a DC power supply of the clamped circuit in a lowermost stage has a DC ground portion of the DC power supply.

3. The high-frequency amplifier according to claim 1, further comprising:
   a comparator disposed between the diode clamped variable power circuit and the supply terminal of the high-frequency amplifier,
   wherein the comparator detects an output of the diode clamped variable power circuit, and compares the detected output with a given reference value for feeding back to the control signal generator circuit.

4. The high-frequency amplifier according to claim 1,
   wherein all of the DC power supplies of the respective diode clamped circuits have an identical voltage value.

5. The high-frequency amplifier according to claim 1,
   wherein a part or all of the DC power supplies of the respective diode clamped circuits have different voltage values,
   wherein the plurality of DC power supplies correspond to an instantaneous power value high in occurrence frequency due to an occurrence probability of the instantaneous power of the modulated analog signal, and the voltage values of the DC power supplies are finely set in a portion where the occurrence probability is high.

6. The high-frequency amplifier according to claim 5,
   wherein a part or all of the DC power supplies of the respective diode clamped circuits have different voltage values, and
   wherein the plurality of DC power supplies correspond to each maximum instantaneous power or each peak power of different communication systems.

7. The high-frequency amplifier according to claim 2,
   wherein a function used in the control signal generator circuit has an offset value fixed to a lower limit value of a generated value, and does not become equal to or lower than the lower limit value.

8. The high-frequency amplifier according to claim 1,
   wherein the control signal generator circuit includes:
   a comparator that compares a reference voltage or a reference current with the envelope signal, and outputs and transmits a difference therebetween as an analog DC potential signal;
   a transistor driver circuit that outputs the control signal for driving the respective transistors within the plurality of diode clamped circuits on the basis of an output signal of the comparator; and
   an isolation circuit that isolates the comparator and the transistor driver circuit from each other in a DC potential, independently.

9. A high-frequency amplifier having a high-frequency amplifying unit that amplifies and outputs a modulated analog signal, the high-frequency amplifier comprising:
an envelope signal acquisition unit for acquiring an envelope signal of the modulated analog signal;
a control signal generator circuit that generates a control signal; and
a diode clamped variable power circuit that is connected to a supply terminal of the high-frequency amplifying unit, and functions as a power circuit of the high-frequency amplifying unit,
wherein the diode clamped variable power circuit includes a plurality of diode clamped circuits each having a DC power supply, a diode, and a power transistor,
wherein each of the diode clamped circuits has an output terminal that outputs a voltage of the DC power supply through the diode,
wherein the diode clamped variable power circuit is structured to stack the clamped circuits in a multistage manner, and the plurality of diode clamped circuits are connected in a multistage manner through the respective output terminals so that the plurality of power transistors are connected in series with the supply terminal,
wherein the DC power supplies corresponding to the respective power transistors are connected in series with one another in a multistage manner,
wherein the control signal generated by the control signal generator circuit is changed according to a given function on the basis of a magnitude of the envelope signal,
wherein the power transistor of each of the diode clamped circuits is controlled according to the control signal, individually, to change the supply voltage of the high-frequency amplifier according to the magnitude of the modulated analog signal, and
wherein a function used in the control signal generator circuit has an offset value fixed to a lower limit value of a generated value, and does not become equal to or lower than the lower limit value.

10. The high-frequency amplifier according to claim 9, wherein the control signal generator circuit includes:
a comparator that compares a reference voltage or a reference current with the envelope signal, and outputs and transmits a difference therebetween as an analog DC signal;
a transistor driver circuit that outputs the control signal for driving the respective transistors within the plurality of diode clamped circuits on the basis of an output signal of the comparator; and
an isolation circuit that isolates the comparator and the transistor driver circuit from each other in a DC potential, independently.

11. A high-frequency module, comprising: a high-frequency amplifier unit that amplifiers a modulated analog signal; and a baseband circuit as a transmission system,
wherein the high-frequency amplifier unit includes:
an envelope signal acquisition unit for acquiring an envelope signal of the modulated analog signal;
a control signal generator circuit that generates a control signal; and
a diode clamped variable power circuit that is connected to a supply terminal of the high-frequency amplifying unit, and functions as a power circuit of the high-frequency amplifying unit,
wherein the diode clamped variable power circuit includes a plurality of diode clamped circuits each having a DC power supply, a diode, and a power transistor,
wherein each of the diode clamped circuits has an output terminal that outputs a voltage of the DC power supply through the diode,
wherein the diode clamped variable power circuit is structured to stack the clamped circuits in a multistage manner, and the plurality of diode clamped circuits are connected in a multistage manner through the respective output terminals so that the plurality of power transistors are connected in series with the supply terminal,
wherein the DC power supplies corresponding to the respective power transistors are connected in series with each other in a multistage manner,
wherein the control signal generator circuit generates the control signal that is changed according to a linear function on the basis of a magnitude of the envelope signal, and
wherein the power transistor of each of the diode clamped circuits is controlled according to the control signal which is changed according to the linear function, individually, to change the supply voltage of the high-frequency amplifying unit according to the magnitude of the modulated analog signal.

12. The high-frequency module according to claim 11, wherein a function used in the control signal generator circuit has an offset value fixed to a lower limit value of a generated value, and does not become equal to or lower than the lower limit value.

13. The high-frequency module according to claim 10, wherein the control signal generator circuit includes:
a comparator that compares a reference voltage or a reference current with the envelope signal;
a transistor driver circuit for driving the respective transistors within the plurality of diode clamped circuits on the basis of an output signal of the comparator; and
an isolation circuit that isolates the comparator and the transistor driver circuit from each other in a DC potential, independently.

14. A wireless machine, comprising: a high-frequency amplifier unit that amplifiers an input modulated analog signal; and a baseband circuit as a transmission system,
wherein the high-frequency amplifier unit includes:
an envelope signal acquisition unit for acquiring an envelope signal of the modulated analog signal;
a control signal generator circuit that generates a control signal; and
a diode clamped variable power circuit that is connected to a supply terminal of the high-frequency amplifying unit, and functions as a power circuit of the high-frequency amplifying unit,
wherein the diode clamped variable power circuit includes a plurality of diode clamped circuits each having a DC power supply, a diode, and a power transistor,
wherein each of the diode clamped circuits has an output terminal that outputs a voltage of the DC power supply through the diode,
wherein the diode clamped variable power circuit is structured to stack the clamped circuits in a multistage manner, and the plurality of diode clamped circuits are connected in a multistage manner through the respective output terminals so that the plurality of power transistors are connected in series with the supply terminal,
wherein the DC power supplies corresponding to the respective power transistors are connected in series with one another in a multistage manner, wherein the control signal generator circuit generates the control signal that is changed according to a linear function on the basis of a magnitude of the envelope signal, and wherein the power transistor of each of the diode clamped circuits is controlled according to the control signal which is changed according to the linear function, individually, to change the supply voltage of the high-frequency amplifying unit according to the magnitude of the modulated analog signal.

15. The wireless machine according to claim 14, wherein a function used in the control signal generator circuit has an offset value fixed to a lower limit value of a generated value, and does not become equal to or lower than the lower limit value.

* * * * *